United States Patent
Kawamata et al.

(10) Patent No.: US 11,004,665 B2
(45) Date of Patent: May 11, 2021

(54) PLASMA PROCESSING APPARATUS

(71) Applicant: SHIBAURA MECHATRONICS CORPORATION, Yokohama (JP)

(72) Inventors: Yoshio Kawamata, Yokohama (JP); Daisuke Ono, Yokohama (JP)

(73) Assignee: SHIBAURA MECHATRONICS CORPORATION, Kanagawa (JP)

( * ) Notice: Subject to any disclaimer, the term of this patent is extended or adjusted under 35 U.S.C. 154(b) by 315 days.

(21) Appl. No.: 15/941,817

(22) Filed: Mar. 30, 2018

(65) Prior Publication Data
US 2018/0286644 A1    Oct. 4, 2018

(30) Foreign Application Priority Data

Mar. 31, 2017 (JP) .............................. JP2017-073032
Jan. 22, 2018 (JP) .............................. JP2018-008444

(51) Int. Cl.
  *H01J 37/34* (2006.01)
  *H01J 37/32* (2006.01)
  (Continued)

(52) U.S. Cl.
  CPC ........... *H01J 37/3411* (2013.01); *H01J 37/32* (2013.01); *H01J 37/3211* (2013.01);
  (Continued)

(58) Field of Classification Search
  CPC ........ C23C 14/221; C23C 14/46; H01J 37/32; H01J 37/3211; H01J 37/32449;
  (Continued)

(56) References Cited

U.S. PATENT DOCUMENTS 4,420,385 A * 12/1983 Hartsough .......... C23C 14/0078
                                              204/192.15
5,225,057 A *  7/1993 LeFebvre .................. C23C 8/02
                                              204/192.12
(Continued)

FOREIGN PATENT DOCUMENTS

JP    3586198 B2    11/2004
JP    4428873 B2    12/2009
(Continued)

*Primary Examiner* — Rodney G McDonald
(74) *Attorney, Agent, or Firm* — Nath, Goldberg and Meyer; Jerald L. Meyer

(57) ABSTRACT

A plasma processing apparatus includes a vacuum container, a conveyance unit including a rotator and circulating and carrying a workpiece through the conveyance path, a cylindrical member having an opening at one end extended in the direction toward the conveyance path, a window member provided at the cylindrical member, and dividing a gas space from the exterior thereof, a supply unit supplying the process gas in the gas space, and an antenna generating inductive coupling plasma on the workpiece. The supply unit supplies the process gas from plural locations where a passing time at which the surface of the rotator passes through a process region is different, and the plasma processing apparatus further includes an adjusting unit individually adjusting the supply amounts of the process gas from the plural locations of the supply unit per a unit time in accordance with the passing time.

17 Claims, 10 Drawing Sheets

(51) Int. Cl.
*H01L 21/687* (2006.01)
*H01L 21/02* (2006.01)
*H01L 21/285* (2006.01)

(52) U.S. Cl.
CPC .. *H01J 37/32449* (2013.01); *H01J 37/32779* (2013.01); *H01L 21/02532* (2013.01); *H01L 21/02631* (2013.01); *H01L 21/28568* (2013.01); *H01L 21/68764* (2013.01); *H01L 21/68771* (2013.01); *H01J 2237/20214* (2013.01); *H01J 2237/3323* (2013.01)

(58) Field of Classification Search
CPC ............ H01J 37/32779; H01J 37/3411; H01J 2237/20214; H01J 2237/3323; H01L 21/02532; H01L 21/02631; H01L 21/28568; H01L 21/68764; H01L 21/68771
USPC ........ 204/298.26, 298.28, 298.07; 118/723 I, 118/723 IR, 730; 156/345.48
See application file for complete search history.

(56) References Cited

U.S. PATENT DOCUMENTS

| | | | |
|---|---|---|---|
| 2006/0189046 A1* | 8/2006 | Song | C23C 14/0078 438/149 |
| 2014/0024200 A1* | 1/2014 | Kato | C23C 16/45551 438/473 |
| 2014/0120731 A1* | 5/2014 | Xu | H01J 37/32642 438/710 |

FOREIGN PATENT DOCUMENTS

| TW | 201130399 A | 9/2011 |
|---|---|---|
| TW | 201339357 A | 10/2013 |
| TW | 201637095 A | 10/2016 |

* cited by examiner

PLASMA PROCESSING APPARATUS

CROSS-REFERENCE TO RELATED APPLICATION

This application is based upon and claims the benefit of priority from Japan Patent Application No. 2017-073032, filed on Mar. 31, 2017, and Japan Patent Application No. 2018-008444, filed on Jan. 22, 2018, the entire contents of which are incorporated herein by reference.

FIELD OF THE INVENTION

The present disclosure relates to a plasma processing apparatus.

BACKGROUND

In manufacturing processes of various products, such as a semiconductor element, a liquid crystal display, and an optical disk, a thin film like an optical film may be formed on a workpiece, such as a wafer or a glass substrate. This thin film is formed by, for example, film formation process of forming a metal film, etc., on the workpiece, and film processing like etching, oxidization or nitridation to the formed film.

Film formation and film processing can be performed in various schemes, and an example scheme of them is the scheme which applies plasma. In the film formation, an inactive gas is introduced into a chamber in which a target is placed, and a DC voltage is applied to the target to obtain the plasma inactive gas. The ions of the plasma inactive gas are caused to be collided with the target, and materials beaten out from the target are deposited on a workpiece to form a film. In the film processing, a process gas is introduced in a chamber in which an electrode is placed, and a high-frequency voltage is applied to the electrode to obtain the plasma process gas. Active species, such as ions and radicals of the plasma process gas, are caused to be collided with the film on the workpiece, thereby performing the film processing.

In order to enable a sequential execution of such film formation and film processing, JP 4428873 B discloses a plasma processing apparatus which has a rotation table that is a rotator installed in a chamber, and which also has multiple film formation units and film processing units installed in the circumferential direction above the rotation table. A workpiece is held on the rotation table and carried in the manner so as to pass through the spaces right below the film formation unit and the film processing unit, and thus an optical film, etc., is formed.

Some plasma processing apparatuses with the rotation table utilize, as a film processing unit, a cylindrical electrode which has a closed upper end and has an opened lower end. When the cylindrical electrode is applied, an opening is provided in the upper part of the chamber, and the upper end of the cylindrical electrode is attached to this opening via an insulation member. A side wall of the cylindrical electrode is extended inside the chamber, and the opened lower end of the cylindrical electrode faces the rotation table via a slight gap. The chamber is grounded, and the cylindrical electrode serves as an anode, while the chamber and the rotation table serve as a cathode. The process gas is introduced in the cylindrical electrode, and the high-frequency voltage is applied to generate plasma. Electrons contained in the generated plasma flow into the cathode that is the rotation table. By causing to pass the workpiece held by the rotation table through the space right below the opened lower end of the cylindrical electrode, active species, such as ions and radicals produced by the plasma are collided with the workpiece, and thus film processing is executed.

Since workpieces, etc. to be processed are increasing the size in recent years, and the improvement of the process efficiency is also required, there is a tendency such that the region where plasma is generated to perform film formation and film processing is increasing. When, however, a voltage is applied to the cylindrical electrode to generate plasma, it is sometimes difficult to generate high-density plasma in a wide range.

Accordingly, JP 3586198 B discloses a plasma processing apparatus that generates relatively high-density plasma in a wide range, thus capable of performing a film processing on a large-size workpiece. According to such a plasma processing apparatus, an antenna is installed outside the chamber via a window member like a dielectric between the antenna and a gas space where the process gas is introduced. By applying a high frequency voltage to the antenna, plasma is generated in the gas space by inductive coupling, and thus the film processing is performed.

In such a plasma processing apparatus that utilizes the rotation table as described above, a consideration is now given to a case in which a film processing unit by inductive coupling plasma is utilized as the film processing unit. In this case, in order to suppress the increase in weight of the dielectric, etc., that is the window, the width of window that is the dielectric, etc., in the circumferential direction of the rotation table may be made constant. In accordance with this constant width, the width of the region where film processing is performed in the circumferential direction of the rotation table, i.e., the process region may be made parallel in the direction along the radial direction of the rotation table. Meanwhile, a difference in speed to pass through the process region on the surface of the rotation table occurs between the inner circumference side of the rotation table and the outer circumference side thereof. That is, the passing speed within the same distance becomes faster at the outer circumference side of the rotation table, and becomes slower at the inner circumference side thereof. When the width of the process region is made parallel in the direction along the radial direction of the rotation table as described above, as for the surface of the rotation table, the outer circumference side passes through the process region faster than the inner circumference side. For this reason, the film processing rate after the process for a certain time becomes greater at the inner circumference side than at the outer circumference side.

In this case, when, for example, film processing, such as oxidization or nitridation, is performed on the niobium or silicon film formed by the film formation unit to form a chemical compound film, the degree of oxidization or nitridation of the niobium or silicon film becomes remarkably different between the inner circumference side of the rotation table and the outer circumference side thereof. Accordingly, it is difficult to uniformly perform a film processing across the entire workpiece, and to change the degree of the processing at the desired position of the workpiece.

This technical problem also occurs when a semiconductor wafer, etc., that is the workpieces are arranged in sequence in the circumferential direction on the rotation table and plasma processing is performed on the workpieces. Moreover, it becomes a further remarkable problem when multiple workpieces are arranged in sequence in the radial direction and the plasma processing is performed in view of the process efficiency, etc. More specifically, when the radius of the rotation table exceeds 1.0 m, and the width of the process region becomes a size that reaches substantially 0.5 m, the difference in processing rate becomes quite large between the inner circumference side and the outer circumference side.

An objective of the present disclosure is to provide a plasma processing apparatus that is capable of performing a desired plasma processing on a workpiece circulated and carried by a rotator in accordance with positions where the passing speed to the surface of the rotator differs.

SUMMARY OF THE INVENTION

In order to achieve the above objective, a plasma processing apparatus according to the present disclosure includes:

a vacuum container capable of achieving a vacuumed interior;

a conveyance unit that comprises a rotator provided in the vacuum container and rotating with a workpiece being mounted thereon, and circulates and carries the workpiece along a circular conveyance path by rotating the rotator;

a cylindrical member having an opening at one end extended in a direction toward the conveyance path in the vacuum container;

a window member provided at the cylindrical member, and dividing a gas space between the interior of the cylindrical member and the rotator where a process gas is introduced from an exterior;

a supply unit supplying the process gas in the gas space; and an antenna installed near the window member and outside the gas space, and causing the process gas in the gas space to generate inductive coupling plasma for plasma processing on the workpiece passing through the conveyance path when power is applied, in which:

the supply unit supplies the process gas from plural locations where a passing time at which a surface of the rotator passes through a process region where the plasma processing is performed is different; and the plasma processing apparatus further comprises an adjusting unit individually adjusting supply amounts of the process gas from the plural locations of the supply unit per a unit time in accordance with the passing time through the process region.

The plasma processing apparatus may further include:

a plurality of supply ports provided corresponding to the plural locations where the supply unit supplies the process gas; and a dispersing plate installed at a location that faces the supply port with a clearance therefrom, dispersing the process gas supplied from the supply port, and causing the dispersed process gas to flow into the gas space.

A flow channel of the process gas between the dispersing plate and the supply port may be blocked at a rotator side, but may be in connected with the gas space at a window-member side.

The adjusting unit may adjust the supply amount of the process gas introduced from each of the supply ports in accordance with a position in a direction that intersects the conveyance path.

The plasma processing apparatus may further include a film formation unit provided at a location facing the workpiece circulated and carried along the conveyance path, and depositing a film formation material on the workpiece by sputtering to form a film, in which the film processing by inductive coupling plasma may be performed on a film of the film formation material deposited on the workpiece by the film formation unit.

The supply ports may be provided in a film formation region that corresponds to a region where the film formation unit forms the film, and is an annular region along the conveyance path, and may also be provided outside the film formation region; and the supply port provided outside the film formation region may be not subjected to the adjustment of the supply amount of the process gas by the adjusting unit.

The supply ports may be provided at locations facing with each other across the gas space, and in a direction along the conveyance path.

The adjusting unit may adjust the supply amount of the process gas introduced from each of the supply ports in accordance with a film thickness to be formed on the workpiece and the passing time.

According to the present disclosure, a desired plasma processing can be performed on a workpiece circulated and carried by a rotator in accordance with positions where the passing speed to the surface of the rotator differs.

DETAILED DESCRIPTION OF THE EMBODIMENTS

An embodiment according to the present disclosure (hereinafter, referred to as this embodiment) will be described in detail with reference to the figures.

[Outline]

Figure 1:
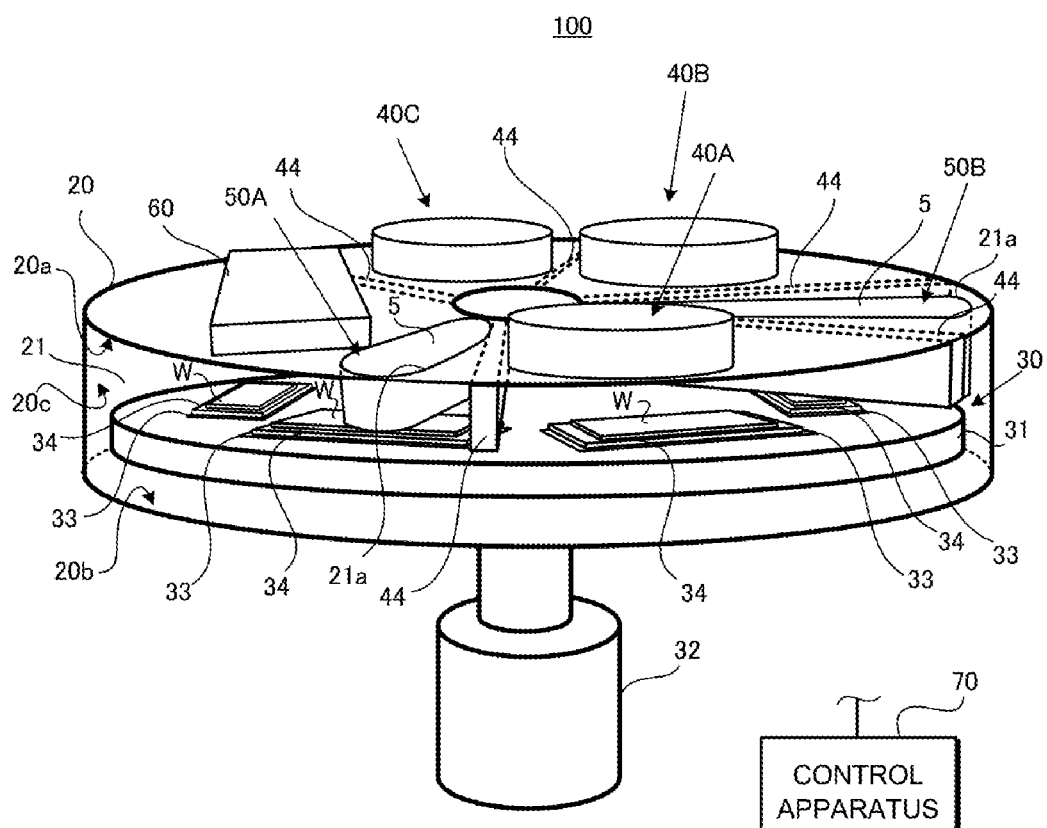
FIG. 1 is a transparent perspective view of a plasma processing apparatus according to an embodiment.
Figure 2:
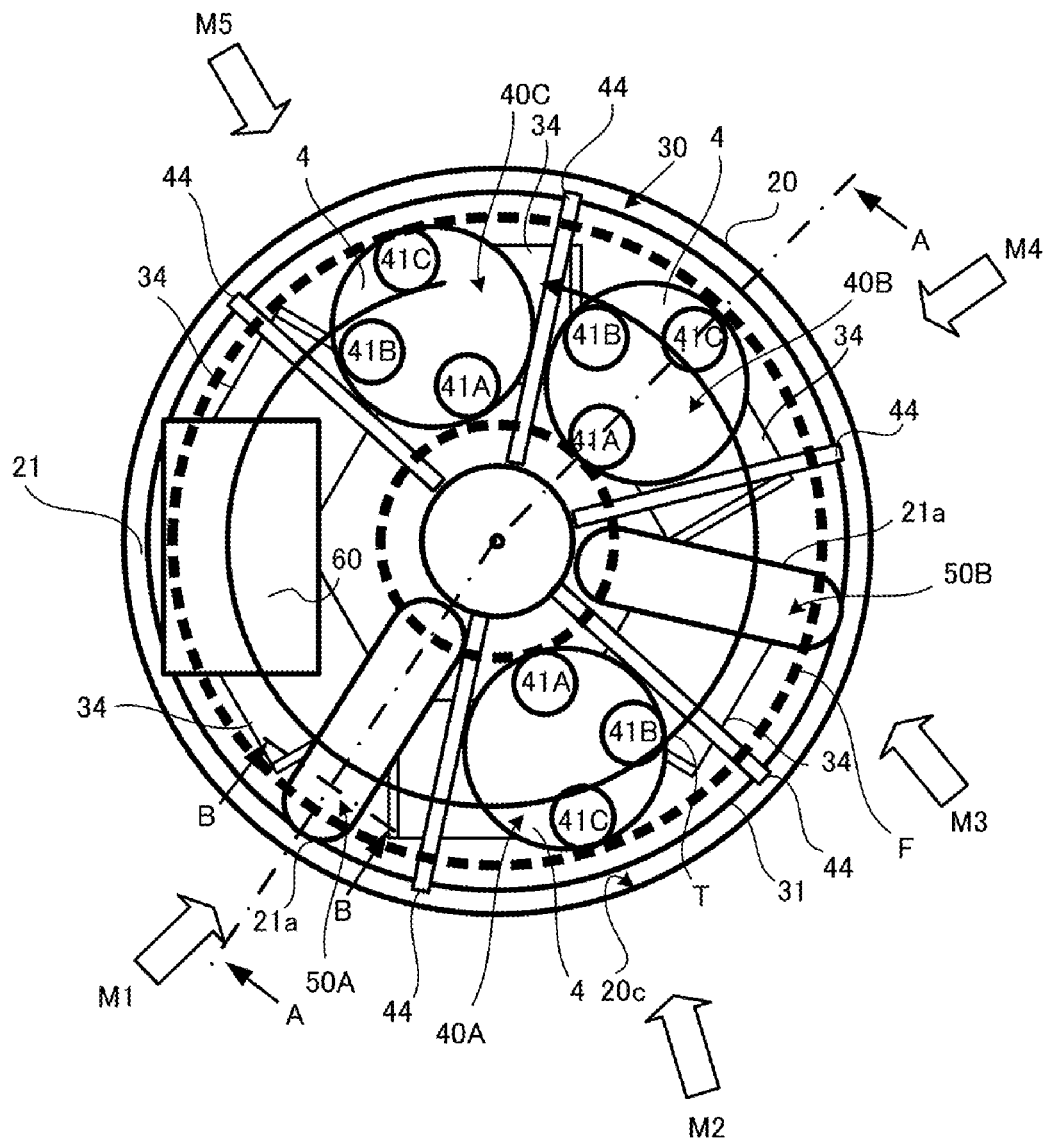
FIG. 2 is a transparent plan view of the plasma processing apparatus according to the embodiment.
Figure 3:
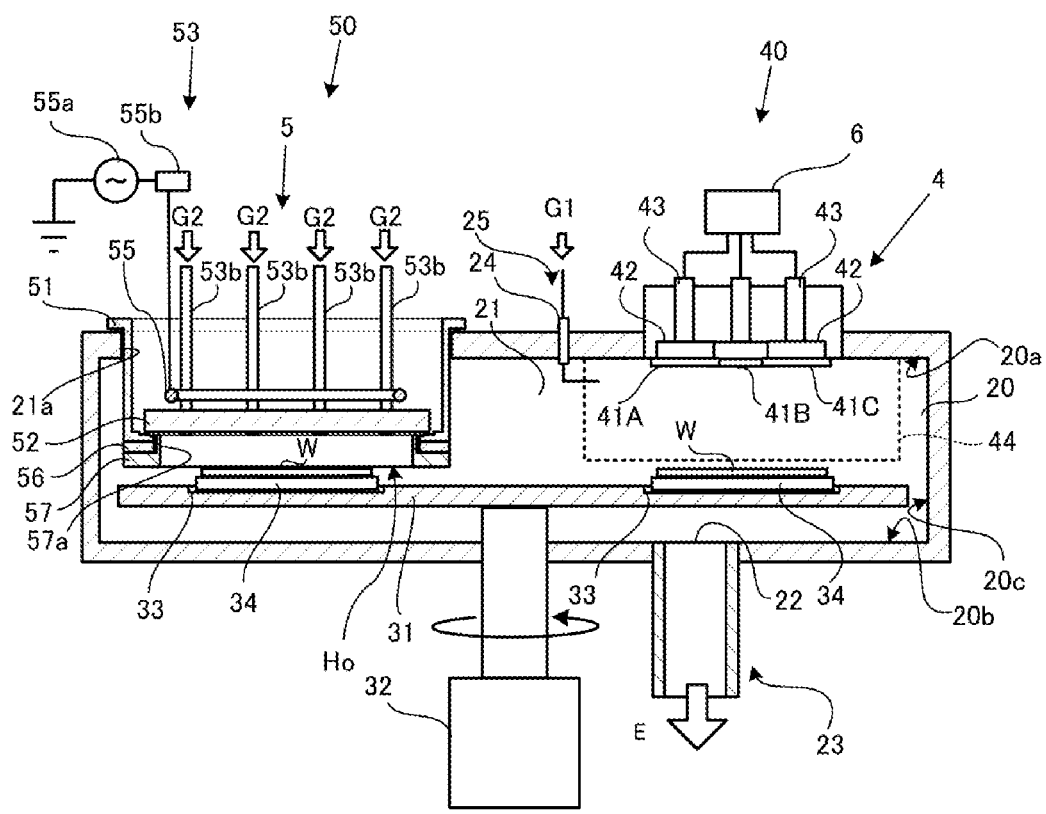
FIG. 3 is a cross-sectional view along a line A-A in FIG. 2.

A plasma processing apparatus 100 illustrated in FIG. 1 forms a chemical compound film, on the surface of each workpiece W, by using plasma. That is, according to this plasma processing apparatus 100, as illustrated in FIGS. 1 to 3, when a rotator 31 rotates, the workpiece W on a tray 34 held by a holding unit 33 moves along a circular trajectory. This movement causes the workpiece W to repeatedly pass through the positions that face film formation units 40A and 40B or 40C. The particles of each target 41A to 41C are stuck to the surface of the workpiece W by sputtering every time the workpiece W passes through the positions. In addition, the workpiece W repeatedly passes through the position facing film processing unit 50A or 50B. The particles sticking to the surface of the workpiece W is combined with the material contained in an introduced process gas G2, and become a compound film every time the workpiece W passes through the position.

[Structure]

As illustrated in FIGS. 1 to 3, such a plasma processing apparatus 100 includes a vacuum container 20, a conveyance unit 30, film formation units 40A, 40B, and 40C, film processing units 50A and 50B, a load lock unit 60, and a control apparatus 70.

[Vacuum Container]

The vacuum container 20 is a container, i.e., a chamber capable of evacuating the interior thereof. The vacuum container 20 has a vacuum chamber 21 formed therein. The vacuum chamber 21 is a sealed space in a cylindrical shape surrounded and defined by a ceiling 20a, an inner bottom 20b, and an inner circumference side 20c of the interior of the vacuum container 20. The vacuum chamber 21 has gas-tightness, and can be vacuumed by depressurization. In addition, the ceiling 20a of the vacuum container 20 is formed so as to be opened and closed.

A reactive gas G is introduced to the predetermined region in the interior of the vacuum chamber 21. The reactive gas G contains a sputter gas G1 for film formation, and a process gas G2 for film processing (see FIG. 3). In the following description, when the sputter gas G1 and the process gas G2 are not distinguished, those may be collectively referred to as the reactive gas G. The sputter gas G1 causes the produced ions by plasma generated by application of power to collide with targets 41A to 41C, and causes the materials of the targets 41A to 41C to be deposited on the surface of the workpiece W. For example, inactive gas like argon gas can be applied as the sputter gas G1.

The process gas G2 causes the active species produced by the plasma generated by inductive coupling to penetrate through the film deposited on the surface of the workpiece W, thus forming a chemical compound film. In the following description, a surface process that utilizes plasma but does not utilize the targets 41A to 41C will be referred to as a reverse sputtering. The process gas G2 can be changed as appropriate for the purpose of processing. When, for example, oxidation and nitridation of the film are performed, a mixture gas of oxygen $O_2$ and nitrogen $N_2$ is applied.

As illustrated in FIG. 3, the vacuum container 20 has a discharge port 22 and an inlet port 24. The discharge port 22 is an outlet for ensuring a flow of gas between the exterior and the vacuum chamber 21, and for performing exhaust E. This discharge port 22 is, for example, formed in the bottom portion of the vacuum container 20. A discharge unit 23 is connected to the discharge port 22. The discharge unit 23 includes unillustrated pump, valve, etc. The discharging process by the discharge unit 23 depressurizes the interior of the vacuum chamber 21.

The inlet port 24 is an opening which introduces the sputter gas G1 to each of the film formation units 40A, 40B, and 40C. This inlet port 24 is, for example, provided in the upper part of the vacuum container 20. A gas supply unit 25 is connected to this inlet port 24. The gas supply unit 25 includes, in addition to pipe, unillustrated gas supply source of the reactive gas G, pump, valve, etc. The sputter gas G1 is introduced in the vacuum chamber 21 from the inlet port 24 by this gas supply unit 25. In addition, an opening 21a in which the film processing units 50A and 50B to be described later are inserted is formed in the upper part of the vacuum container 20.

[Conveyance Unit]

The outline of the conveyance unit 30 will be described. The conveyance unit 30 includes the rotator 31 that is provided in the vacuum container 20, and on which the workpiece W is mounted. The conveyance unit 30 rotates the rotator 31, thereby circulating and carrying the workpiece W along a circumference of a conveyance path T. The circulation and carriage mean to repeatedly move the workpiece W along the circular trajectory. The conveyance path T is a trajectory on which the workpiece W or the tray 34 to be described later is moved by the conveyance unit 30, and is a circular ring with a width. Hereinafter, the details of the conveyance unit 30 will be described.

The rotator 31 is a flat circular rotation table. The rotator 31 may be formed by, for example, thermally spraying aluminum oxide on the surface of the tabular member formed of stainless steel. In the following description, when simply referred to as "circumferential direction", it means "the circumferential direction of the rotator 31", and when simply referred to as a "radial direction", it means "the radial direction of the rotator 31". In addition, in this embodiment, although a flat plate substrate is utilized as an example of the workpiece W, the type, the shape, and the material of the workpiece W subjected to plasma processing are not limited to any particular ones. For example, a curved substrate which has a recess or a protrusion at the center may be adopted. Still further, the workpiece W that contains conductive materials, such as metal and carbon, insulative materials, such as glass and rubber, and semiconductors like silicon may be adopted. Still further, the number of workpieces W subjected to plasma processing is not limited to any particular number.

In addition to the rotator 31, the conveyance unit 30 has a motor 32 and a holding unit 33. The motor 32 gives drive force to the rotator 31 to rotate around the center of the circle. The holding unit 33 is a component that holds the tray 34 carried by the conveyance unit 30. The multiple holding units 33 are installed on the surface of the rotator 31 at an equal pitch along a circumference. The surface of the rotator 31 as described in this embodiment is the surface facing upwardly, i.e., the upper surface when the rotator 31 is horizontal. For example, the region where each holding unit 33 holds the tray 34 is formed in a direction parallel to the tangent line of the circle in the circumferential direction of the rotator 31, and is provided at an equal pitch in the circumferential direction. More specifically, the holding unit 33 is a groove, a hole, protrusion, a jig, a holder, etc., that holds the tray 34, and can be formed by a mechanical chuck, a sticking chuck, etc.

The tray 34 has, on a side of a rectangular flat plate, a flat mount surface on which the workpiece W is mounted. It is desirable that the material of the tray 34 should have a high thermal conductivity, e.g., metal. In this embodiment, the material of the tray 34 is SUS. The material of the tray may be ceramics and resin with a high thermally conductivity, or a combination thereof. The workpiece W may be directly mounted on the mount surface of the tray 34, or may be indirectly mounted thereon via a frame, etc., that has a sticking sheet. The single workpiece W may be mounted on each tray 34, or the multiple workpieces W may be mounted.

In this embodiment, since the six holding units 33 are provided, the six trays 34 are held on the rotator 31 at the pitch of 60 degrees. However, the number of the holding units 33 may be one or a multiple number. The rotator 31 circulates and carries the trays 34 on which the workpieces W are mounted, and causes the trays 34 to repeatedly pass through the positions facing the film formation units 40A, 40B, and 40C and the film processing units 50A and 50B.

[Film Formation Unit]

The film formation units 40A, 40B, and 40C are provided at positions that face the workpiece W that is circulated and carried along the conveyance path T, and deposit the film formation material on the workpiece W by sputtering to form a film. In the following description, when the multiple film formation units 40A, 40B, and 40C are not distinguished, those will be collectively referred to as the film formation unit 40. As illustrated in FIG. 3, the film formation unit 40 has a sputter source 4, a dividing unit 44, and a power supply unit 6.

(Sputter Source)

The sputter source 4 is a supply source of the film formation material which deposits the film formation material on the workpiece W by sputtering to form a film. As illustrated in FIGS. 2 and 3, the sputter source 4 includes the targets 41A, 41B, and 41C, backing plates 42, and electrodes 43. The targets 41A, 41B, and 41C are each formed of the film formation material to be deposited on the workpiece W and to be a film, and are installed at positions on the conveyance path T and facing with each other with a clearance.

In this embodiment, the three targets 41A, 41B, and 41C are provided at the positions aligned on the vertices of a triangle as in a planar view. The targets 41A, 41B, and 41C are arranged in sequence in this order from the side close to the rotation center of the rotator 31 toward the outer circumference. In the following description, when the targets 41A, 41B, and 41C are not distinguished, those will be collectively referred to as the target 41. The surface of the target 41 faces, with a clearance, the workpiece W moved by the conveyance unit 30. In addition, the region where the film formation material are deposited by three targets 41A, 41B, and 41C is larger than the dimension of the tray 34 in the radial direction. Thus, a circular region that corresponds to the region where the film formation is performed by the film formation unit 40, and is along the conveyance path T will be referred to as a film formation region F (indicated with a dashed line in FIG. 2). The width of the film formation region F in the radial direction is longer than the width of the tray 34 in the radial direction. In addition, in this embodiment, the three targets 41A to 41C are arranged so as to deposit film formation material across the entire width of the film formation region F in the radial direction without a void.

As for the film formation material, silicon, niobium, etc., are applied. However, various materials are applicable as long as a film can be formed by sputtering. In addition, the target 41 is, for example, in a cylindrical shape. However, other shapes, such as a rectangular cylindrical shape and a columnar cylindrical shape, are adoptive.

The backing plate 42 holds each target 41A, 41B, and 41C individually. The electrode 43 is a conductive member for applying power to each target 41A, 41B, and 41C from the exterior of the vacuum container 20. The power to be applied to each target 41A, 41B, and 41C can be individually changed. Note that the sputter source 4 is provided with a permanent magnet, a cooling mechanism, etc., as appropriate.

(Dividing Unit)

The dividing unit 44 divides film formation positions M2, M4, and M5 where the film formation is performed on the workpiece W by the sputter source 4, and film processing positions M1 and M3 where film processing is performed. As illustrated in FIG. 2, the dividing unit 44 is a rectangular wall plate radially installed from the rotation center of the rotator 31 of the conveyance unit 30. The dividing units 44 are, for example, provided between, on the ceiling 20a of the vacuum chamber 21, the film processing unit 50A, the film formation unit 40A, the film processing unit 50B, the film formation unit 40B, and the film formation unit 40C. The lower end of the dividing unit 44 faces the rotator 31 with a clearance through which the workpiece W passes. The presence of the dividing unit 44 suppresses the reactive gases G of the film formation positions M2, M4 and M5 and the film formation materials thereof from dispersing in the vacuum chamber 21.

The ranges of the film formation positions M2, M4, and M5 in the horizontal direction are divided by the pair of dividing units 44. The film formation materials are deposited on the surface of the workpiece W as a film when the workpiece W circulated and carried by the rotator 31 repeatedly passes through the positions facing the respective targets 41 of the film formation positions M2, M4, and M5. Although the most part of the film formation is performed in these film formation positions M2, M4, and M5, there is a leakage of the film formation material in the region other than such regions, thus there is a little film formation material deposition. That is, the region where the film formation is performed is slightly wider than each film formation position M2, M4, and M5.

(Power Supply)

The power supply unit 6 applies the power to the target 41. Application of the power to the target 41 by this power supply unit 6 generates the plasma sputter gas G1. The film formation material beaten out from the target 41 is deposited on the workpiece W by causing the ions produced by plasma to collide with the target 41. The power applied to each target 41A, 41B, and 41C can be individually changed. In this embodiment, the power supply unit 6 is, for example, a DC power supply that applies a high voltage. In the case of an apparatus that performs high frequency sputtering, an RF power supply may be adopted. In addition, the power supply unit 6 may be provided for each of the film formation units 40A, 40B, and 40C, or the single power supply unit 6 may be provided for the multiple film formation units 40A, 40B, and 40C. When the single power supply unit 6 is provided application of power is switched for each target. The rotator 31 has the same potential as that of the grounded vacuum container 20, and a potential difference is produced by applying a high voltage to the target 41.

The film formation amount within a certain time period, i.e., a film formation rate can be increased by simultaneously forming a film by using the same film formation material to the multiple film formation units 40A, 40B, and 40C. In addition, a film formed of the layers of the multiple film formation materials can also be formed by the film formation units 40A, 40B, and 40C to which the different types of film formation materials are applied.

In this embodiment, as illustrated in FIG. 2, the three film formation units 40A, 40B, and 40C are installed between the film processing units 50A and 50B in the carrying direction of the conveyance path T. The film formation positions M2, M4, and M5 correspond to the three film formation units 40A, 40B, and 40C, respectively. The film processing positions M1 and M3 correspond to the two film processing units 50A and 50B, respectively.

[Film Processing Unit]

The film processing units 50A and 50B perform film processing on the material deposited on the workpiece W carried by the conveyance unit 30. This film processing is a reverse sputtering that does not utilize the target 41. In the following description, when the film processing units 50A and 50B are not distinguished, those will be collectively referred to as the film processing unit 50. The film processing unit 50 has a processing unit 5. An example structure of this processing unit 5 will be described with reference to FIGS. 3 to 6.

Figure 4:
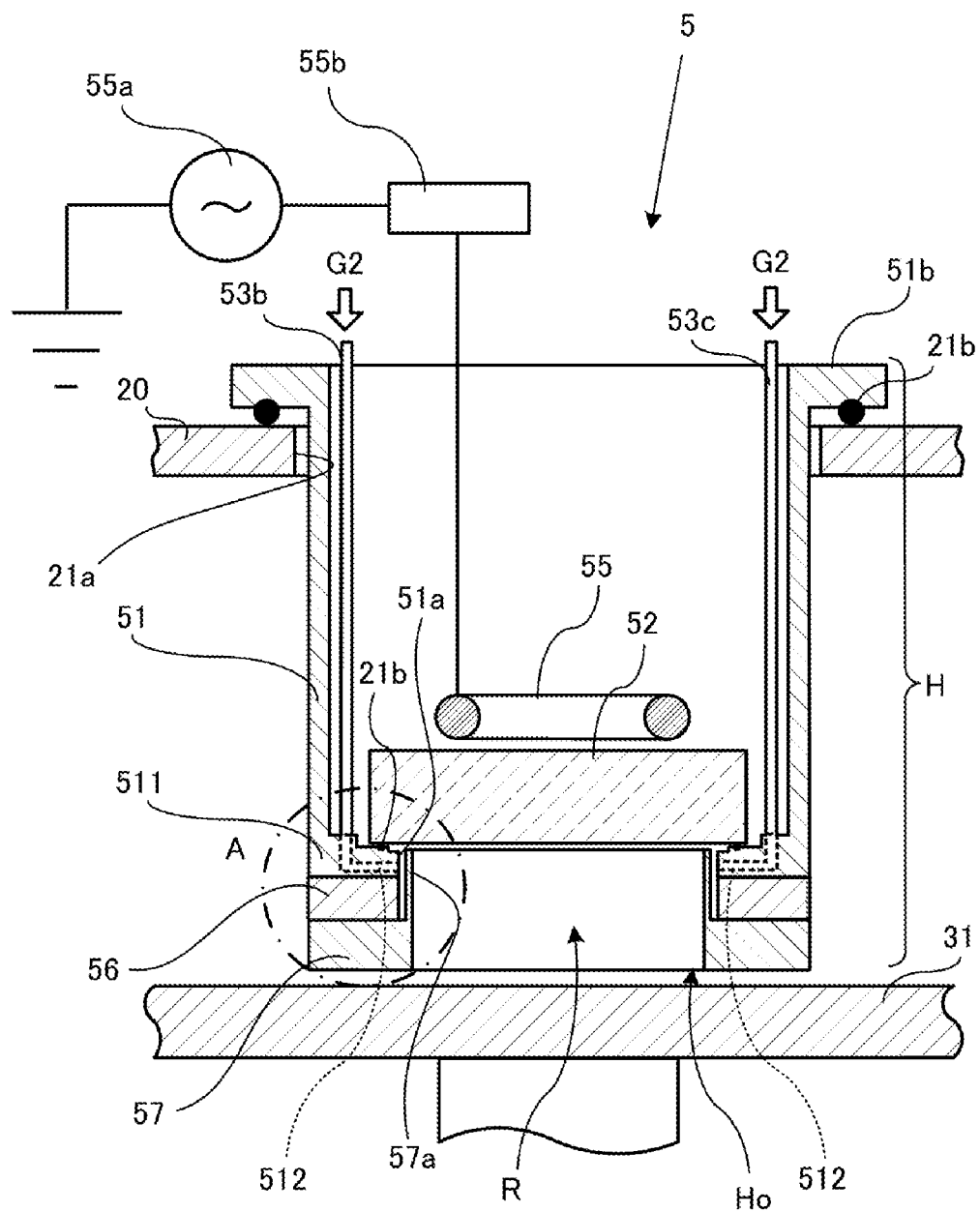
FIG. 4 is a cross-sectional view along a line B-B in FIG. 2.

As illustrated in FIGS. 3 and 4, the processing unit 5 has a cylindrical member H, a window member 52, a supply unit 53, an adjusting unit 54 (see FIG. 8), and an antenna 55. The cylindrical member H is a cylindrical component extended in the direction in which an opening Ho at an end is directed toward the conveyance path T inside the vacuum container 20. The cylindrical member H has a cylindrical body 51, a cooling part 56 and a dispersing part 57. Among the members that form the cylindrical member H, first, the cylindrical body 51 will be described, and the cooling part 56 and the dispersing part 57 will be described later. The cylindrical body 51 has a horizontal cross-section that is in a rectangular shape with rounded corners. The term rectangular shape with rounded corners is a shape of the track for athletic sports. The track shape is a shape that has a pair of partial circles facing with each other with a distance therebetween and with an outward protruding direction, and respective both ends are connected by parallel straight lines. The cylindrical body 51 is formed of the same material as that of the rotator 31. The cylindrical body 51 is inserted in the opening 21a provided in the ceiling 20a of the vacuum container 20 in such a way that the opening 51a is directed toward the rotator 31 side with a distance. Hence, the most part of the side walls of the cylindrical body 51 are held in the vacuum chamber 21. The cylindrical body 51 is installed in such a way that the longer radius direction is in parallel with the radial direction of the rotator 31. A strict parallel is unnecessary, and a slight slant is allowable. Moreover, the process region where plasma processing, i.e., the film processing is performed is in a rectangular shape with rounded corners similar to the shape of the opening 51a of the cylindrical body 51. That is, the width of the process region in the rotation direction is consistent in the radial direction.

Figure 5:
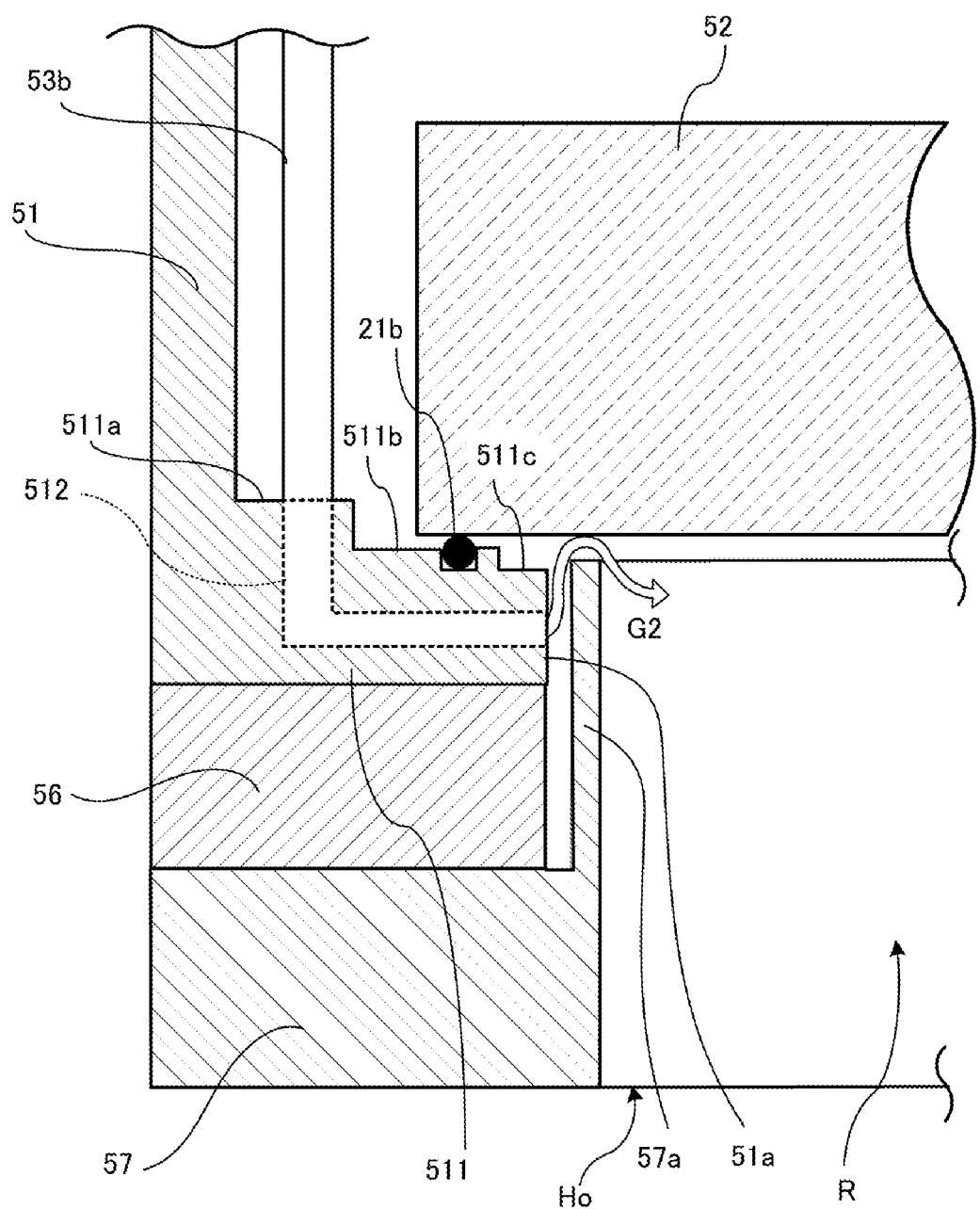
FIG. 5 is an enlarged view illustrating the details of a section A in FIG. 4.

As illustrated in FIGS. 4 and 5, an inner flange 511 is formed at one end of the cylindrical body 51 across the entire circumference. The inner flange 511 is a thickened part at which the inner edge of the one end of the cylindrical body 51 protrudes across the entire circumference in such a way that the vertical cross-section orthogonal to the outer circumference becomes an L-shape. The innermost edge of this inner flange 511 forms the opening 51a in a rectangular shape with rounded corners that is approximately similar to the cross-section of the cylindrical body 51. The inner flange 511 has seats 511a, 511b, and 511c that are located at positions which become lower from the inner wall of the cylindrical body 51 toward the opening 51a, thus forming a shape like a stair.

Figure 7:
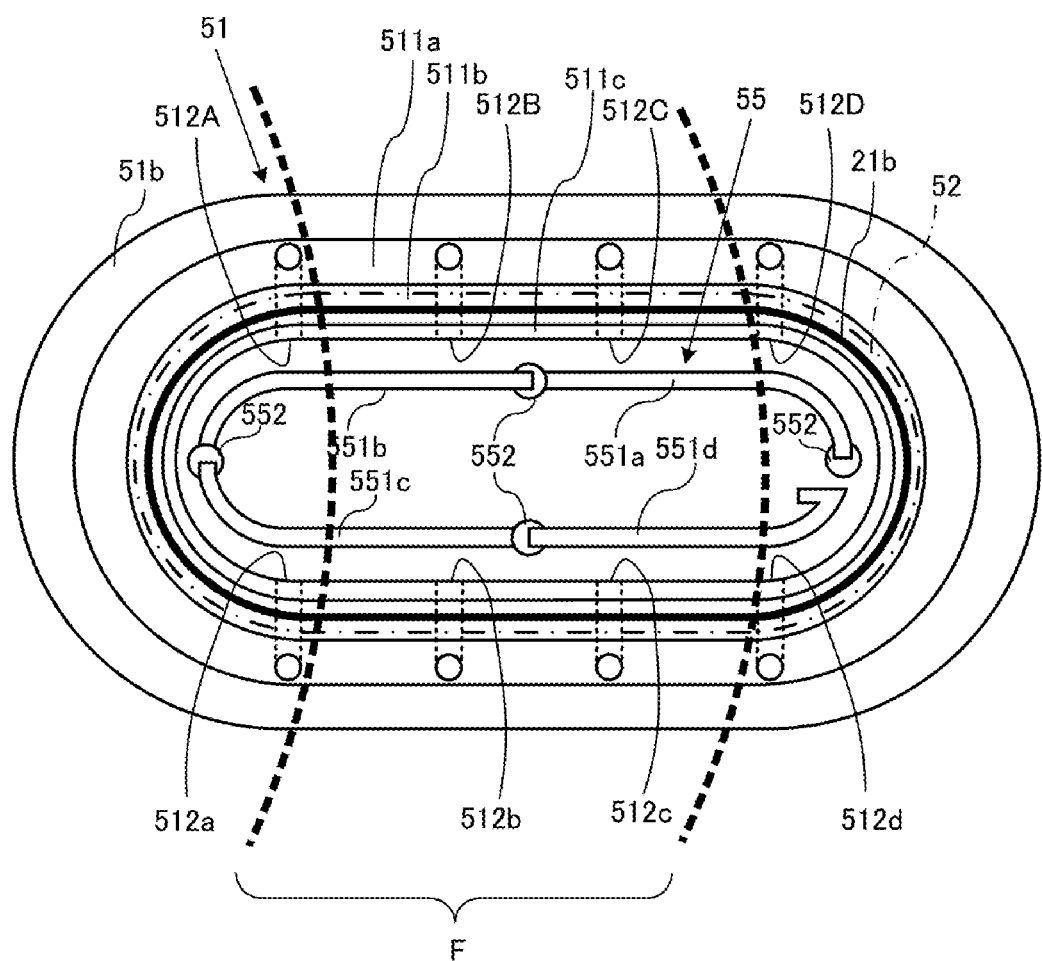
FIG. 7 is a transparent plan view illustrating the processing unit according to the embodiment.
Figure 8:
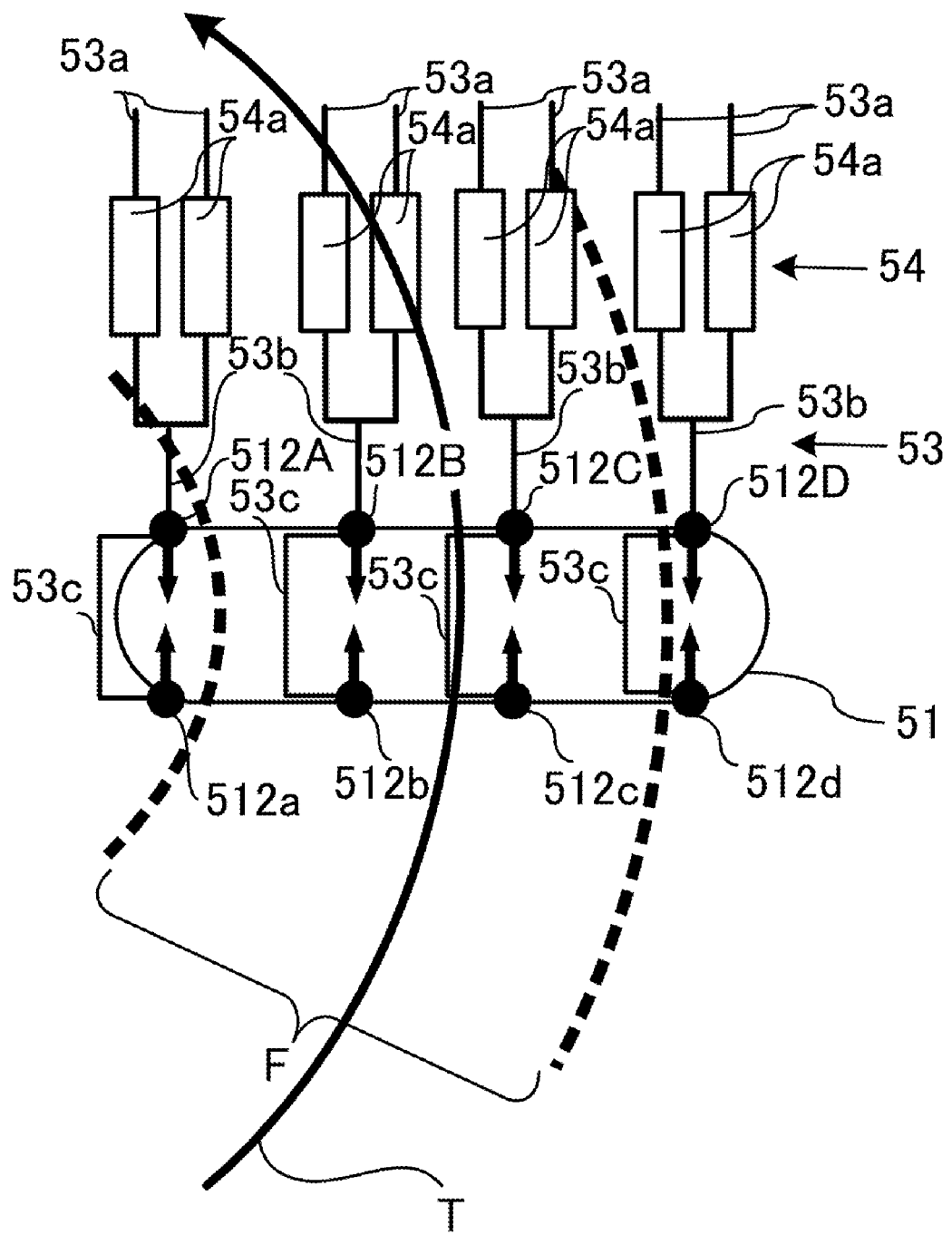
FIG. 8 is an exemplarily diagram illustrating a flow channel of a process gas.

As illustrated in FIGS. 7 and 8, the inner flange 511 is provided with multiple supply ports 512A to 512D and 512a to 512d. In the following description, when the individual supply ports 512A to 512D and 512a to 512d are not distinguished, those will be collectively referred to as the supply port 512. As illustrated in FIGS. 4 and 5, the supply port 512 is a hole that supplies the process gas G2 in the cylindrical body 51. As illustrated in FIG. 5, each supply port 512 penetrates from the seat 511a to the opening 51a so as to be in an L-shape.

In this case, when the workpiece W mounted on the rotator 31 is compared between the center side (inner circumference side) of the rotator 31 and the outer circumference side thereof, a difference is caused in the speed that passes through a certain distance. That is, in this embodiment, the cylindrical body 51 is installed in such a way that the longer radius direction is in parallel with the radial direction of the rotator 31. In addition, the straight portions of the opening 51a where the multiple supply ports 512 are formed are in parallel with each other in the radial direction. According to such a structure, the time for the workpiece W to pass through the certain distance below the cylindrical body 51 is shorter at the outer circumference side of the rotator 31 than the inner circumference side thereof. Hence, the multiple supply ports 512 are provided at multiple locations where the time at which the surface of the rotator 31 passes through the process regions for plasma processing differs. The direction in which the multiple supply ports 512 are provided side by side intersects the conveyance path T. In addition, the supply ports 512 are provided at locations facing with each other across the gas space R. The direction in which the supply ports 512 are provided side by side so as to face with each other across the gas space R is along the conveyance path T.

More specifically, as illustrated in FIG. 8, the supply ports 512A to 512D are provided side by side at the equal pitch along the lengthwise direction of the cylindrical body 51, i.e., the one inner wall in the longer side direction. In addition, the supply ports 512a to 512d are provided side by side along the other inner wall in the lengthwise direction of the cylindrical body 51. The supply ports 512A to 512D are provided in the sequence of the supply port 512A, the supply port 512B, the supply port 512C, and the supply port 512D from the inner circumference side toward the outer circumference side. Similarly, the supply ports 512a to 512d are provided side by side in the sequence of the supply port 512a, the supply port 512b, the supply port 512c, and the supply port 512d. The supply ports 512A to 512D are provided at the downstream side of the conveyance path T, while the supply ports 512a to 512d are provided at the upper stream side of the conveyance path T. Moreover, the supply port 512A faces the supply port 512a, the supply port 512B faces the supply port 512b, the supply port 512C faces the supply port 512c, and the supply port 512D faces the supply port 512d at the upper stream and the downstream side, respectively.

Furthermore, as illustrated in FIG. 4, an outer flange 51b is formed at the end of cylindrical body 51 opposite to the opening 51a. Installed between the lower surface of the outer flange 51b and the ceiling of the vacuum container 20 is an O-ring 21b across the entire circumference, and thus the opening 21a is gas-tightly sealed.

The window member 52 is provided on the cylindrical member H, and divides the gas space R in the vacuum container 20 where the process gas G2 is introduced, from the exterior thereof. In this embodiment, the window member 52 is provided on the cylindrical body 51 that forms the cylindrical member H. In the film processing unit 50, the gas space R is formed between the rotator 31 and the interior of the cylindrical member H, and the workpiece W circulated and carried by the rotator 31 repeatedly passes through the gas space R. The window member 52 is fitted in the interior of the cylindrical body 51, and is a dielectric plate that has an approximately similar shape to the horizontal cross-section of the cylindrical body 51. The window member 52 is placed on the O-ring 21b fitted in the groove formed circularly in the seat 511b, thus gas-tightly sealing the opening 51a. The window member 52 may be a dielectric like alumina, or may be a semiconductor like silicon.

Figure 6:
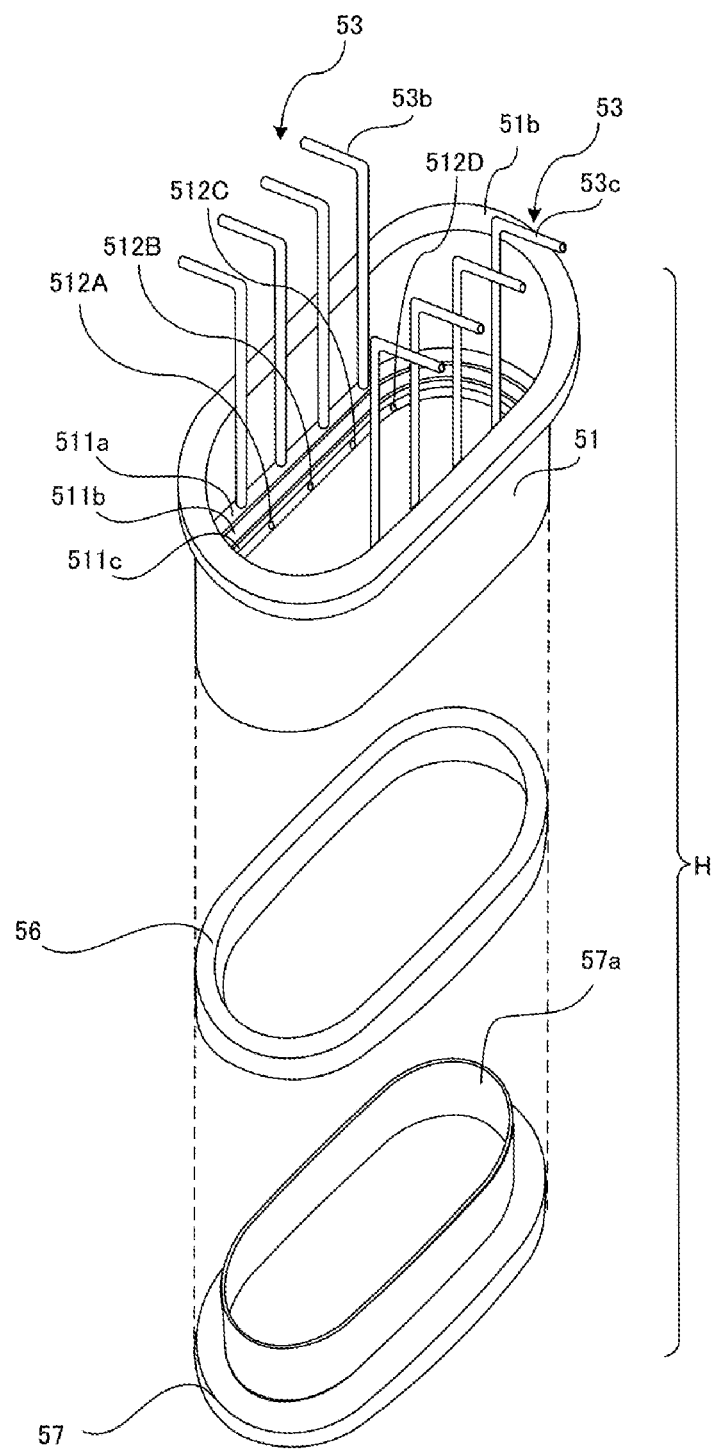
FIG. 6 is an exploded perspective view illustrating a processing unit according to the embodiment.

As illustrated in FIGS. 4, 6 and 8, the supply unit 53 supplies the process gas G2 in the gas space R. The supply unit 53 is a mechanism that supplies the process gas G2 from the multiple locations where the time at which the surface of the rotator 31 passes through the process region differs. Such multiple locations correspond to the locations where the above described supply ports 512 are provided in the lengthwise direction of the cylindrical body 51. More specifically, the supply unit 53 includes an unillustrated supply source of the process gas G2 like a gas tank, and pipes 53a, 53b, and 53c connected thereto. The process gas G2 is, for example, oxygen and nitrogen. The pipe 53a is a pair of paths from the respective supply sources of the process gas G2. That is, the pipe 53a includes the path connected to the oxygen supply source and the path connected to the nitrogen supply source. Four sets of the pipes 53a are provided correspondingly to the provided locations of the supply ports 512. The pipe 53b is a path where the pair portions of the pipe 53a are merged. Each pipe 53b is connected to each supply port 512A to 512D in the one row. Moreover, the pipe 53c that is branched from each pipe 53b is connected to each supply port 512a to 512d in the other row.

The individual leading end of the branched pipe 53c extends toward the opening 51a along the inner wall of the cylindrical body 51 from the outer flange 51b side, and is connected to the end of the supply port 512 at the seat-511a side. The pipe 53b is similarly connected to the end of the supply port 512 at the seat-511a side. Hence, the supply unit 53 supplies the process gas G2 to the gas space R from the multiple locations where the passing speed of the workpiece W differs via the supply ports 512A to 512D and the supply ports 512a to 512d provided side by side as described above. That is, the supply ports 512A to 512D and the supply ports 512a to 512d are provided corresponding to the multiple locations where the supply unit 53 supplies the process gas G2. In this embodiment, the supply ports 512A and 512a at the innermost circumference and the supply ports 512D and 512d at the outermost circumference are located outside the film formation region F.

As illustrated in FIG. 8, the adjusting unit 54 adjusts the supply amount of the process gas G2 introduced from each supply port 512 in accordance with the position in the direction that intersects with the conveyance path T. That is, the adjusting unit 54 adjusts individually the supply amount of the process gas G2 per a unit time by the supply unit 53 at the multiple locations in accordance with the time at which the surface of the rotator 31 passes through the process region. The adjusting unit 54 has mass-flow controllers (MFCs) 54a provided at respective portions of the pair of pipe 53a. The MFC 54a is a member that includes a mass flowmeter which measures the flow volume of a fluid, and an electromagnetic valve which controls the flow volume.

Figure 9:
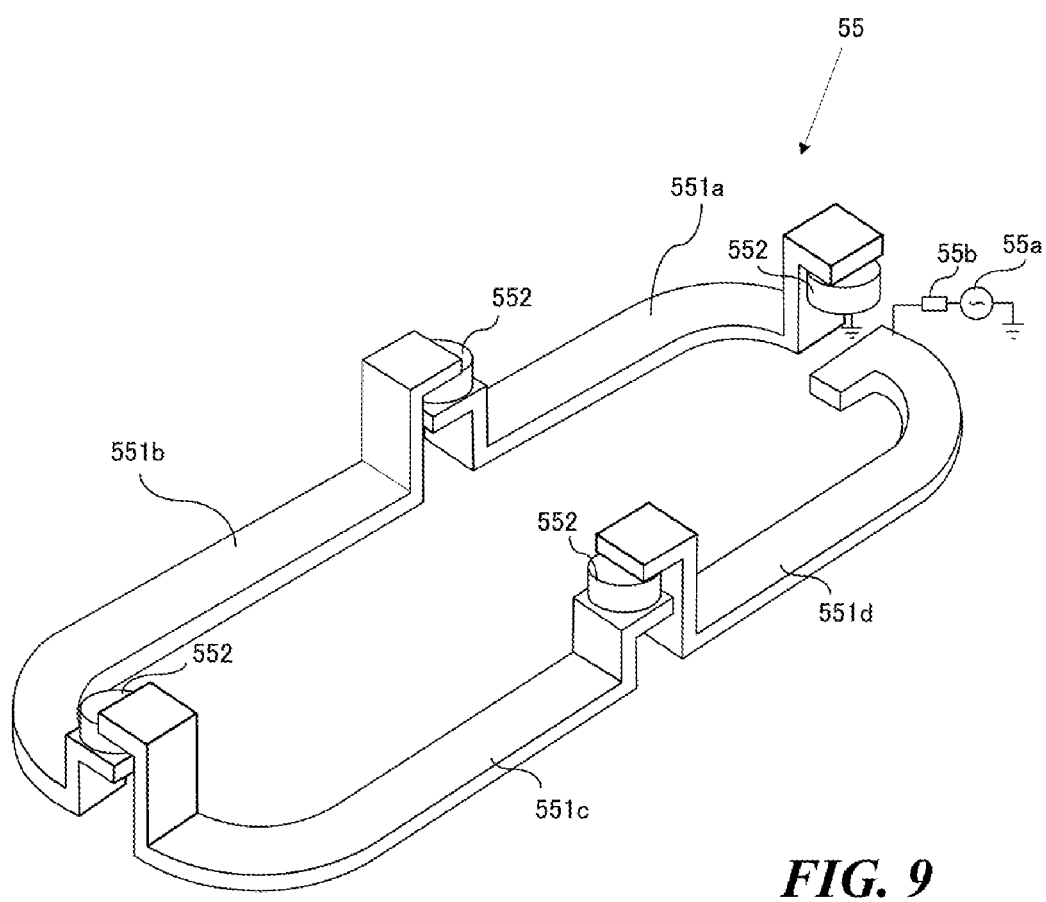
FIG. 9 is a perspective view illustrating an antenna according to the embodiment.

The antenna 55 generates the inductive coupling plasma to process the workpiece W that passes through the conveyance path T as illustrated in FIGS. 4, 7 and 9. The antenna 55 is installed outside the gas space R and near the window member 52. Application of power to the antenna 55 produces the electric field induced by the magnetic field produced by an antenna current, causing the process gas G2 in the gas space R to be turned into plasma. The distribution shape of the inductive coupling plasma to be generated can be changed by the shape of the antenna 55. In other words, the distribution shape of the inductive coupling plasma can be defined by the shape of the antenna 55. In this embodiment, the inductive coupling plasma in an approximately similar distribution shape to the horizontal cross-section of the gas space R can be generated by employing the antenna 55 in the shape as described below.

The antenna 55 includes multiple conductors 551a to 551d and capacitors 552. The multiple conductors 551 are each a band-shape conductive member, and form an electrical path in a rectangular shape with rounded corners in a planar view when connected to each other via the capacitors 552. The external shape of this antenna 55 is equal to or smaller than the opening 51a.

Each capacitor 552 is in a substantially cylindrical shape, and is connected in series between the conductors 551a, 551b, 551c, and 551d. When the antenna 55 is formed of conductors only, voltage amplitude becomes excessive at the end near the power supply, and the window member 52 is eliminated locally. Accordingly, by dividing a conductor and connecting the capacitor 552, a small voltage amplitude occurs at the end of each conductor 551a, 551b, 551c, and 551d, suppressing the local elimination of the window member 52.

However, in the capacitor 552 part, the continuity of the conductors 551a, 551b, 551c and 551d is discontinued, decreasing the plasma density. For this reason, the respective ends of the conductors 551a, 551b, 551c, and 551d facing with the window member 52 are overlapped with each other in the planar direction, thus holding the capacitor 552 from the upper side and from the lower side. More specifically, as illustrated in FIG. 9, connection ends of the conductors 551a, 551b, 551c and 551d to the capacitor 552 are bent so as to have a reverse L-shape cross-section. Clearances that hold the capacitor 552 from the upper side and from the lower side are formed in the horizontal planes at the respective ends of the adjacent conductors 551a and 551b. Likewise, clearances that hold the capacitor 552 from the upper side and from the lower side are formed in the horizontal planes at the respective ends of the conductors 551b and 551c, and the horizontal planes at the respective ends of the conductors 551c and 551d.

An RF power supply 55a for applying the high frequency power is connected to the antenna 55. A matching box 55b that is a matching circuit is connected in series at the output side of the RF power supply 55a. For example, one end of the conductor 551d and the RF power supply 55a is connected to each other. In this example, the conductor 551a is a ground side. The matching box 55b is connected between the RF power supply 55a and the one end of the conductor 551d. The matching box 55b matches the impedance at the input side with the impedance at the output side, thereby stabilizing the plasma discharge.

As illustrated in FIGS. 4 to 6, the cooling part 56 is a cylindrical member in a rectangular shape with rounded corners that substantially matches the outer shape of the cylindrical body 51, and has an upper surface contacting and matching the bottom of the cylindrical body 51. Although it is not illustrated in the figure, cavities through which cooling water flows are provided in the cooling part 56. In the cavity, a supply port and a discharge port, connected to a chiller that is a cooling water circulating apparatus that circulates and supplies the cooling water, are in connected with each other. The cooling water cooled by the chiller is supplied from the supply port, flows through the cavities, and is discharged from the discharge port. By repeating such procedures, the cooling part 56 is cooled, thus suppressing the heating of the cylindrical body 51 and the dispersing part 57.

The dispersing part 57 is a cylindrical member in a rectangular shape with rounded corners that matches the external shapes of the cylindrical body 51 and the cooling part 56, and has an upper surface contacting and matching the bottom of the cooling part 56. The opening Ho of the cylindrical member H is provided in such a bottom surface.

The dispersing part 57 is provided with a dispersing plate 57a. The dispersing plate 57a is disposed at the position with a clearance from the supply port 512 and facing the supply port 512, disperses the process gas G2 introduced from the supply port 512, and causes this gas to flow in the gas space R. The dispersing part 57 has a greater width in the horizontal direction at the annular part than the cylindrical body 51 by an amount corresponding to the dispersing plate 57a provided inwardly.

More specifically, the dispersing plate 57a stands upright from the inner edge of the dispersing part 57 across the entire circumference, goes over the cooling part 56, and is extended to the position near the bottom of the window member 52. As illustrated in FIG. 5, the flow channel of the process gas G2 between the dispersing plate 57a and the supply port 512 is closed at the rotator-31 side, and is in connected with the gas space R at the window-member-52 side. That is, an annular gap in connected with the gas space R below the window member 52 is formed between the inner flange 511 and the dispersing plate 57a with the upper side of such a gap extending along the lower surface of the window member 52.

The space in the vertical direction between the bottom of the dispersing part 57 and the surface of the rotator 31 has a length that enables the workpiece W in the conveyance path T to pass through. Moreover, since the dispersing plate 57a enters the gas space R in the cylindrical body 51, the plasma generating region in the gas space R becomes the inward space relative to the dispersing plate 57a. The distance between the dispersing plate 57a and the window member 52 can be, for example, 1 to 5 mm. When such a distance is equal to or less than 5 mm, the occurrence of an abnormal discharge in the gap can be prevented.

The process gas G2 is introduced in the gas space R via the supply port 512 from the supply unit 53, and a high frequency voltage is applied to the antenna 55 from the RF power supply 55a. Then, the electric field is generated in the gas space R via the window member 52, generating the plasma of the process gas G2. Hence, active species, such as electrons, ions, and radicals, are produced.

[Load Lock Unit]

The load lock unit 60 carries, while maintaining vacuumed condition of the vacuum chamber 21, the tray 34 on which the unprocessed workpiece W is mounted in the vacuum chamber 21 from the exterior by unillustrated conveyance means, and ejects the tray 34 on which the processed workpiece W is mounted to the exterior of the vacuum chamber 21. A conventionally well-known structure is applicable to this load lock unit 60, and thus a detailed description will be omitted.

[Control Apparatus]

The control apparatus 70 controls each unit of the plasma processing apparatus 100. This control apparatus 70 can be realized by, for example, a special-purpose electronic circuit or a computer that operates under a predetermined program. That is, as for the control on introduction and discharge of the sputter gas G1 and the process gas G2 to the vacuum chamber 21, the control on the power supply unit 6 and the RF power supply 55a, and the control on the rotation of the rotator 31, the control details are programmed beforehand. The control apparatus 70 is executed when the program is run by a processing apparatus, such as a PLC or a CPU, and is capable of coping with various specifications of plasma processing.

Specific control details are as follow. That is, those are the rotating speed of the motor 32, the initial discharging pressure of the plasma processing apparatus 100, the selection of the sputter source 4, the applied power to the target 41 and the antenna 55, the flow volume, type, introducing time and discharging time of the sputter gas G1 and the process gas G2, the time for film formation, and the time for film processing, etc.

In particular, according to this embodiment, the control apparatus 70 controls the power application to the target 41 of the film formation unit 40, and the supply amount of the sputter gas G1 from the gas supply unit 25, thereby controlling the film formation rate. In addition, the control apparatus 70 controls the power application to the antenna 55, and the supply amount of the process gas G2 from the supply unit 53, thereby controlling the film processing rate.

Figure 10:
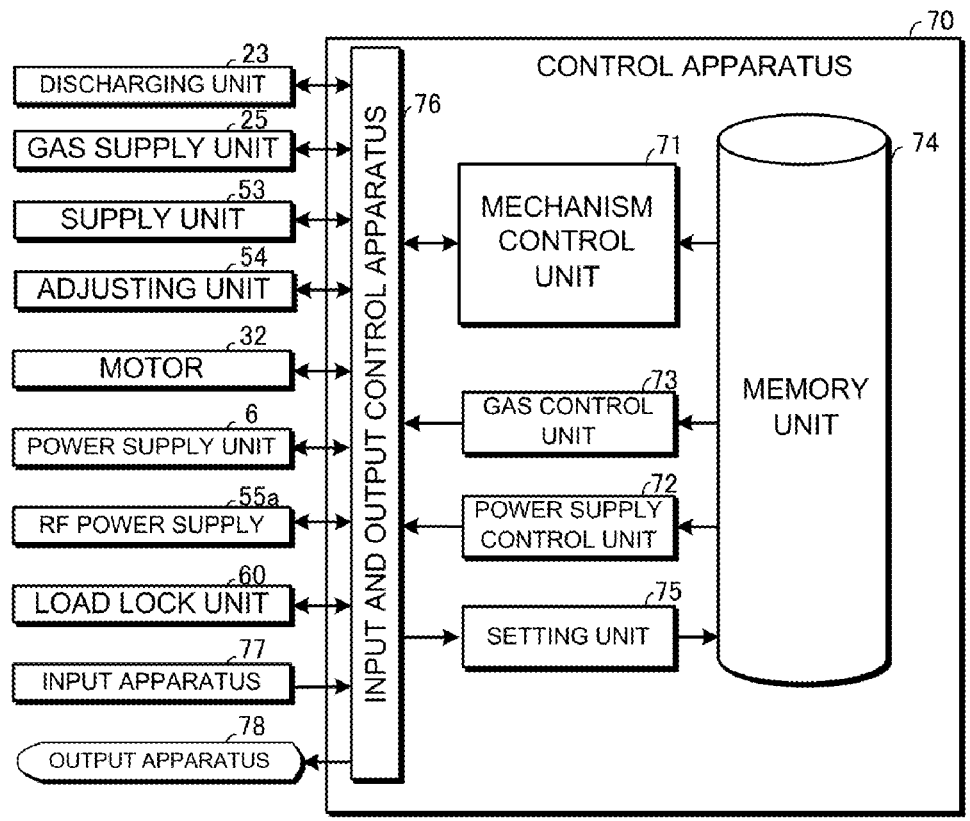
FIG. 10 is a block diagram illustrating a structure of a control apparatus according to the embodiment.

A structure of the control apparatus 70 that causes each unit to execute as describe above will be described with reference to FIG. 10 that is a virtual functional block diagram. That is, the control apparatus 70 includes a mechanism control unit 71, a power supply control unit 72, a gas control unit 73, a memory unit 74, a setting unit 75, and an input and output control unit 76.

The mechanism control unit 71 is a processing unit that controls the drive sources, electro-magnetic valves, switches, power supplies, etc., for the discharge unit 23, the gas supply unit 25, the supply unit 53, the adjusting unit 54, the motor 32, and the load lock unit 60. The power supply control unit 72 controls the power supply unit 6 and the RF power supply 55a. For example, the power supply control unit 72 controls the individual power applied to the targets 41A, 41B, and 41C. When it is desired to achieve a uniform film formation rate throughout the entire workpiece W, in view of the speed difference at the inner circumference side and at the outer circumference side as described above, the power is sequentially increased so as to be the target 41A<the target 41B<the target 41C. That is, the power may be set so as to be proportional to the speed at the inner circumference side and at the outer circumference side. However, the control to be proportional is merely an example, and setting may be made in such a way that the faster speed increments the power so that the uniform processing rate is achieved. In addition, as for the location where a thicker film on the workpiece W is desired, the applied power to the target 41 may be increased, and as for the location where a thinner film is desired, the applied power to the target 41 may be reduced.

The gas control unit 73 controls the introduction amount of the process gas G2 by the adjusting unit 54. For example, the supply amount of the process gas G2 per a unit time from each supply port 512 is controlled individually. When a uniform film processing rate is desired throughout the entire workpiece W, in view of the speed difference at the inner circumference side and at the outer circumference side as described above, the supply amount from each supply port 512 is gradually increased from the inner circumference side toward the outer circumference side. More specifically, the supply amount may be set such as the supply port 512A<the supply port 512B<the supply port 512C<the supply port 512D, and the supply port 512a<the supply port 512b<the supply port 512c<the supply port 512d. That is, the supply amount may be set so as to be proportional to the speed at the inner circumference side and at the outer circumference side. In addition, the supply amount of the process gas G2 to be supplied from each supply port 512 is adjusted in accordance with the film thickness to be formed on the workpiece W. That is, as for the location where the thicker film is desired, the supply amount of the process gas G2 is increased so as to increase the film processing amount. In addition, as for the location where the thinner film is desired, the supply amount of the process gas G2 is decreased so as to decrease the film processing amount. Moreover, as for the film processing on the film that is formed so as to be thicker towards the inner circumference side, for example, the supply amount of the process gas G2 may be set so as to become larger towards the inner circumference side. Consequently, in combination with the relationship with the speed as described above, as a result, the supply amount from each supply port 512 may become uniform. That is, the adjusting unit 54 may adjust the supply amount of the process gas G2 supplied from each supply port 512 in accordance with the film thickness to be formed on the workpiece W and the time at which the rotator 31 passes through the process region. The gas control unit 73 also controls the introduction amount of the sputter gas G1.

The memory unit 74 stores necessary information for the control according to this embodiment. Information stored in the memory unit 74 contains the discharge amount by the discharge unit 23, the power applied to each target 41, the supply mount of the sputter gas G1, the power applied to the antenna 55, and the supply amount of the process gas G2 from each supply port 512. The setting unit 75 is a processing unit that sets externally input information in the memory unit 74. The power to be applied to the antenna 55 is determined in accordance with, for example, the desired film thickness when the rotator 31 rotates by a turn, and the rotating speed (rpm) of the rotator 31.

Moreover, the power to be applied to the targets 41A, 41B, and 41C may be linked with the supply amount of the process gas G2 from the supply port 512A to 512D and 512a to 512d. That is, with the rotating speed (rpm) of the rotator 31 being constant, when the power applied to the targets 41A, 41B, and 41C is set by the setting unit, the supply amount from each supply port 512A to 512D and 512a to 512d may be set so as to be proportional to the set power. In addition, with the rotating speed (rpm) of the rotator 31 being constant, when the supply amount from each supply port 512A to 512D and 512a to 512d is set by the setting unit, the power to be applied to each target 41A, 41B, and 41C may be set so as to be proportional to the set supply amount.

For example, such setting can be made as follow. First, a relationship between the film thickness and the applied power corresponding thereto or the supply amount of the process gas G2 corresponding thereto, and a relationship between the applied power and the supply amount of the process gas G2 corresponding thereto, are obtained beforehand through tests, etc. Next, at least one of such relationships is stored in the memory unit 74 as a look-up table. The setting unit 75 refers to the table in accordance with the input film thickness, applied power or supply amount, and determines the applied power or supply amount.

The input and output control unit 76 is an interface that controls signal conversion, input, and output with each unit subjected to the control. Moreover, the control apparatus 70 is connected to an input apparatus 77 and an output apparatus 78. The input apparatus 77 is input means, such as a switch, a touch panel, a keyboard, and a mouse, for an operator to operate the plasma processing apparatus 100 via the control apparatus 70. For example, a selection of the film formation unit 40 and the film processing unit 50 to be applied, a desired film thickness, an applied power to each target 41A to 41C, and a supply amount of the process gas G2 from each supply port 512A to 512D and 512a to 512d, etc., can be input via the input means.

The output apparatus 78 is output means, such as a display, a lamp, and a meter, etc., that enable the operator to visually check information to confirm the status of the apparatus. For example, the output apparatus 78 is capable of displaying an information input screen via the input apparatus 77. In this case, a scheme that displays the targets 41A, 41B, and 41C and each supply port 512A to 512D and 512a to 512d by exemplary diagrams, and enables a selection of each position and an input of a numerical value may be employed. In addition, a scheme that displays the targets 41A, 41B, and 41C and each supply port 512A to 512D and 512a to 512d by exemplary diagrams, and displays a numerical value set for each target and supply port may be employed.

[Operation]

An operation according to this embodiment as described above will be described below with reference to FIGS. 1 to 10. Although it is not illustrated in the figures, the tray 34 on which the workpiece W is mounted is carried in, carried through, and carried out relative to the plasma processing apparatus 100 by conveyance means, such as a conveyer and a robot arm.

The multiple trays 34 are sequentially carried in the vacuum container 20 by the conveyance means of the load lock unit 60. The rotator 31 moves the empty holding unit 33 to the carrying-in position from the load lock unit 60 in sequence. The holding unit 33 holds the individual tray 34 carried in by the conveyance means. In this way, as illustrated in FIGS. 2 and 3, the trays 34 on which the workpiece W subjected to the film formation is mounted are all placed on the rotator 31.

The process of forming the film on the workpiece W introduced in the plasma processing apparatus 100 as described above is performed as follow. The following operation is an example in which one of the film formation unit 40 and one of the film processing unit 50 are activated, such as the film formation unit 40A only or the film processing unit 50A only, to perform film formation and film processing. However, the multiple film formation units 40 and film processing units 50 may be activated to increase the processing rate. In addition, the example film formation by the film formation unit 40 and film processing by the film processing unit 50 are to form the film of silicon oxynitride.

As for the formation of the silicon oxynitride film is performed by repeating a process of impregnating oxygen ions and nitrogen ions while circulating and carrying the workpiece W every time silicon is stuck on the workpiece W in an atomic order.

First, the vacuum chamber 21 is always exhausted and depressurized by the discharge unit 23. When the vacuum chamber 21 reaches predetermined pressure, as illustrated in FIGS. 2 and 3, the rotator 31 starts rotating. Hence, the workpiece W held by the holding unit 33 moves along the conveyance path T, and passes through the lower spaces of the film formation units 40A, 40B, and 40C and the film processing units 50A and 50B. When the rotator 31 reaches a predetermined rotating speed, the gas supply unit 25 of the film formation unit 40 will supplies the sputter gas G1 around the target 41. At this time, the supply unit 53 of the film processing unit 50 also supplies the process gas G2 to the gas space R.

In the film formation unit 40, the power supply unit 6 applies the power to each target 41A, 41B, and 41C. Hence, the plasma sputter gas G1 is generated. In the sputter source 4, the active species like the ions that are produced by plasma collide with the target 41, and the particles of the film formation material are beaten out from the target 41. Hence, the particles of the film formation material are deposited on the surface of the workpiece W that passes through the film formation unit 40 every time the workpiece W passes through, and thus a film is formed. In this example, a silicon film is formed.

The power applied to each target 41A, 41B, and 41C by the power supply unit 6 is set in the memory unit 74 so as to increase sequentially from the inner circumference side of the rotator 31 toward the outer circumference side. The power supply control unit 72 outputs instructions to the power supply unit 6 so as to apply the controlled power to each target 41 in accordance with the power set in the memory unit 74. Because of such a control, the film formation amount by sputtering per a unit time increases from the inner circumference side toward the outer circumference side, but the passing speed of the rotator 31 increases from the inner circumference side toward the outer circumference side. Consequently, the film thickness across the whole workpiece W becomes uniform.

In addition, since film formation or film processing is not performed on the workpiece W even if the workpiece W passes through the deactivated film formation unit 40 and the deactivated film processing unit 50. Hence, the workpiece W is not heated in this case. Within the region where no heating is applied, the workpiece W releases heat. Note that the deactivated film formation units 40 are, for example, the film formation positions M4 and M5. In addition, the deactivated film processing unit 50 is, for example, the film processing position M3.

The workpiece W having undergone the film formation passes through the position that faces the opening Ho of the cylindrical member H in the processing unit 5. In the processing unit 5, as illustrated in FIG. 8, oxygen and nitrogen that are the process gas G2 are supplied into the gas space R via the supply port 512 from the supply unit 53, and a high frequency voltage is applied to the antenna 55 from the RF power supply 55a. Application of the high frequency voltage applies an electric field in the gas space R via the window member 52, and thus plasma is generated. The oxygen ions and the nitrogen ions that are produced by the generated plasma collide with the surface of the workpiece W having undergone the film formation, thus penetrating through the film formation material.

The flow volume of the process gas G2 introduced from the supply port 512 per a unit time is set in the memory unit 74 so that it decreases toward the inner circumference side of the rotator 31 and increases toward the outer circumference side. The gas control unit 73 outputs an instruction in such a way that the adjusting unit 54 controls the flow volume of the process gas G2 passing through each pipe 53a in accordance with the flow volume set in this memory unit 74. Hence, the amount of the active species like ions per a unit volume produced in the gas space R becomes larger at the outer circumference side than the inner circumference side. Accordingly, the film processing amount depending on the amount of the active species increases toward the outer circumference side from the inner circumference side. However, the process region where the film processing is performed is in a rectangular shape with rounded corners that is similar to the shape of the opening 51a of the cylindrical body 51. Accordingly, the width of the process region, i.e., the width in the rotation direction is consistent in the radial direction. That is, the process region has a constant width in the radial direction. However, the workpiece W has a faster speed to pass through the process region towards the outer circumference side from the inner circumference side. Hence, the workpiece W has a shorter time for passing through the process region at the outer circumference side than at the inner circumference side. By increasing the supply amount of the process gas G2 toward the outer circumference side, the film processing amount increases toward the outer circumference side, and thus the shortness of the passing time through the process region can be compensated. Consequently, the film processing amount becomes uniform throughout the entire workpiece W.

Moreover, when the film processing is performed like oxidization and nitridation process using equal to or greater than two kinds of process gases G2, it is necessary, while the rotator rotates by a turn, to cause the film formed by the film formation unit 40 to be completely a chemical compound film and also to obtain a uniform composition of the film throughout the entire film formation surface. This embodiment is suitable for the plasma processing apparatus 100 that performs film processing using equal to or greater than two kinds of process gases G2. For example, assuming that a film that has a ratio of 1:1 that is a ratio between x and y in silicon oxynitride ($SiO_xN_y$) is desired. In this case, it is necessary to control both the amount of active species that causes a formed film to be sufficiently a chemical compound film, and the ratio between oxygen and nitrogen contained such active species. In this embodiment, there are multiple supply locations of the process gas G2, and the supply amount of the process gas G2 from each supply location is adjusted in accordance with each kind of the process gas G2, facilitating the control of both the amount and the ratio.

Still further, as illustrated in FIG. 5, the process gas G2 supplied from the supply port 512 collides with the dispersing plate 57a, spreads horizontally along the vertical surface of the dispersing plate 57a, and flows in the gas space R from the upper edge of the dispersing plate 57a. Accordingly, since the process gas G2 is dispersed, the flow volume of the process gas G2 only in the vicinity of the supply port 512 does not increase extremely. That is, the distribution of the gas flow volume from the inner circumference side toward the outer circumference side is prevented from having a location where the gas flow volume becomes locally excessive, and increases with a slope similar to a linear slope. This suppresses an occasion such that the film processing rate partially increases or decreases to make the process uneven.

The rotator 31 keeps rotating during the film formation process as described above, and keeps circulating and carrying the trays 34 on which the workpiece W is mounted. Hence, by circulating the workpiece W and repeating the film formation and film processing, a chemical compound film is formed. In this embodiment, as a chemical compound film, the silicon oxynitride film is formed on the surface of the workpiece W.

After a predetermined processing time at which the silicon oxynitride film becomes a desired film thickness elapses, the film formation unit 40 and the film processing unit 50 are deactivated. That is, application of the power to the target 41 by the power supply unit 6, supply of the process gas G2 from the supply port 512, application of the voltage by the RF power 55a, etc., are terminated.

As described above, after the process of forming the film completes, the tray 34 on which the workpiece W is mounted is positioned in sequence to the load lock unit 60 by the rotation of the rotator 31, and is ejected from the plasma processing apparatus 100 by the conveyance means.

[Film Formation Test Results]

Film formation test results by examples according to this embodiment and by a comparative example will be described with reference to a graph that is FIG. 11. First to third examples show test results when the flow volume of oxygen and that of nitrogen from the multiple supply ports 512 per a unit time were increased step by step from the inner circumference side toward the outer circumference side. The first and third examples were example cases in which the dispersing plate 57a was applied, and the second example was an example case in which no dispersing plate 57a was applied but the gas was directly supplied to the gas space from the supply port 512.

In the second and third examples, however, the flow volumes of the process gas G2 supplied from the supply ports 512D and 512d at the outermost circumference outside the film formation region F were not set to be the maximum but set to be less than those of the supply ports 512B, 512C, and 512b and 512c. That is, the flow volume was set such that the supply port 512A<the supply port 512D<the supply port 512B<the supply port 512C, and the supply port 512a<the supply port 512d<the supply port 512b<the supply port 512c.

Since the workpiece W does not pass through the location outside the film formation region F, it is unnecessary to supply the process gas G2 in such a location. However, as illustrated in FIG. 7, when the cylindrical body 51 is formed so as to have a margin outside the film formation region F, if no process gas G2 is supplied to the exterior of the film formation region F at all, a dispersion of the process gas G2 outside the film formation region F occurs near the inner circumferential edge of the film formation region F and near the outer circumferential edge thereof.

Consequently, the processing rate decreases near the inner circumferential edge of the film formation region F and near the outer circumferential edge thereof. Hence, it is appropriate to preliminarily supply the process gas G2 also to outside the film formation region F. Since the amount of the process gas G2 in this case can be an amount that compensates the decrease by dispersion, it is appropriate with such an amount capable of suppressing the dispersion in relation with the dimension of the margin region as described above. However, it is necessary in some cases to increase the supply amount more than those of the supply ports 512C and 512c. Thus, as for the supply ports 512A, 512a, 512D, and 512d located outside the film formation region F, the adjustment of the supply amounts of the process gas G2 may be not adjusted by the adjusting unit 54 in accordance with the passing time.

Moreover, according to the comparative example, the process gas G2 was supplied from the single location. Other conditions are the same as those of the first to the third examples. For example, the applied power to the target 41 was controlled in such a way that the uniform film thickness of the film formed on the workpiece W by the film formation unit 40 was achieved.

Figure 11:
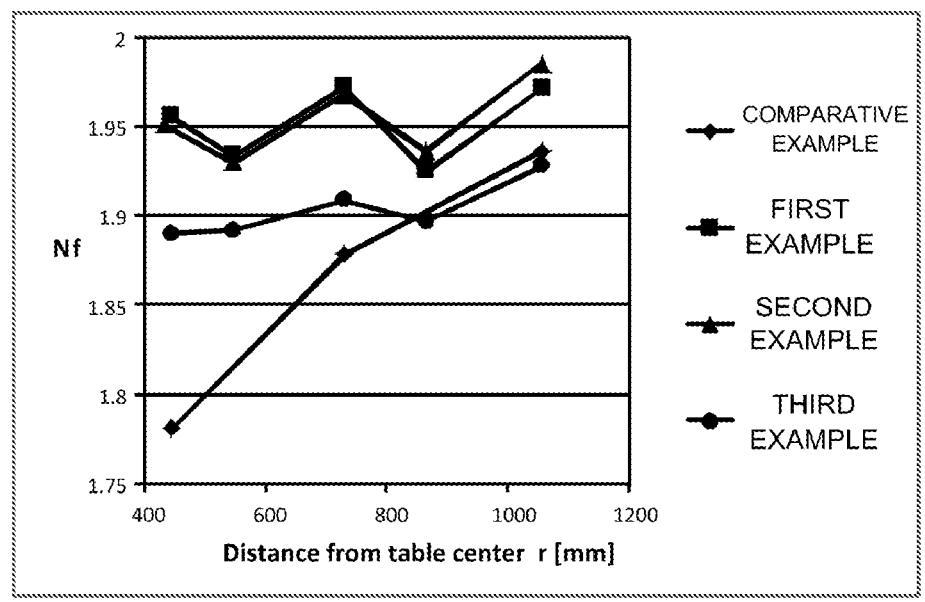
FIG. 11 is a graph illustrating the test result of a comparative example and that of an example.

FIG. 11 has a horizontal axis that indicates the distance [mm] in the radial direction from the rotation center of the rotator 31 toward the outer circumference, and the vertical axis that indicates the refractive index Nf of the formed film. Since the refractive index of the film changes in accordance with the film processing amount, the film processing amount can be known by measuring the refractive index. As is clear from this graph, the comparative example has a large variability in refractive index at the inner circumference side and at the outer circumference side, which was ±4.17%. In contrast, the first example has a variability of ±1.21%, and the second example has a variability of ±1.40%. The third example has the minimum variability of ±1.00%.

It becomes clear from such test results that, by adjusting the flow volume of the process gas G2 from each supply port 512, the variability in film processing can be suppressed from the inner circumference side toward the outer circumference side. In addition, it becomes clear that, by providing the dispersing plate 57a, the entire film processing can be made further close to the uniform processing amount.

Moreover, although the relevance of the supply ports 512D and 512d outside the film formation region F to the film processing is small and it is unnecessary to have the maximum flow volume of the process gas G2, it becomes clear that by supplying the process gas G2 even in a small amount, the film processing amount can be made further uniform. This is considered to be similar for the supply ports 512A and 512a at the inner circumference side. That is, the effect of making the film processing amount uniform can be achieved also by providing the supply port 512 outside the film formation region F.

[Action and Effect]

(1) According to this embodiment, the plasma processing apparatus includes the vacuum container 20 capable of achieving a vacuumed interior, the conveyance unit 30 that includes the rotator 31 provided in the vacuum container 20 and rotating with the workpiece W being mounted thereon, and circulates and carries the workpiece W along the circular conveyance path T by rotating the rotator 31, the cylindrical member H having the opening Ho at one end extended in the direction toward the conveyance path T in the vacuum container 20, the window member 52 provided at the cylindrical member H, and dividing the gas space R between the interior of the cylindrical member H and the rotator 31 where the process gas G2 is introduced from the exterior of the gas space R, the supply unit 53 that supplies the process gas G2 in the gas space R, and the antenna 55 installed near the window member 52 and outside the gas space R, and causing the process gas G2 in the gas space R to generate inductive coupling plasma for plasma processing on the workpiece W passing through the conveyance path T when power is applied. Moreover, the supply unit 53 supplies the process gas G2 from plural locations where a passing time at which the surface of the rotator 31 passes through a process region where the plasma processing is performed is different, and the plasma processing apparatus further includes the adjusting unit 54 that individually adjusts the supply amounts of the process gas G2 from the plural locations of the supply unit 53 per a unit time in accordance with the passing time through the process region.

Accordingly, the plasma processing amount on the workpiece W circulated and carried by the rotator 31 can be adjusted in accordance with the location where the passing speed of the surface of the rotator 31 is different. This enables a desired plasma processing, such that the processing amount on the workpiece W is made uniform, or the processing amount for a desired location is changed, to be performed. This is more effective when the diameter of the rotator 31 is larger and the width of the film formation region F is greater, i.e., the difference in speed between the inner circumference side of the film formation region F and the outer circumference side thereof is greater. According to this embodiment, since shape of the opening 51a of the cylindrical body 51 where the process gas G2 is introduced is in the rectangular shape with rounded corners like the shape of the antenna 55, the process gas G2 can be more exactly supplied to the gas space R near the antenna 55, and thus highly efficient plasma can be achieved.

(2) Moreover, according to this embodiment, the plasma processing apparatus includes the plurality of supply ports 512 provided corresponding to plural locations where the supply unit 53 supplies the process gas G2, and supplying the process gas G2 to the gas space R, and the dispersing plate 57a installed at a location that faces the supply port 512 with a clearance from the supply port 512, dispersing the process gas G2 supplied from the supply port 512, and causing the dispersed process gas G2 to flow into the gas space R.

Hence, the dispersing plate 57a disperses the process gas G2, suppressing a local concentration of the gas flow, thereby suppressing the occurrence of the process variability. Moreover, the dispersing plate 57a suppresses the occurrence of a hollow cathode electric discharge at the supply port 512. When, for example, there is no dispersing plate 57a, and the supply port 512 is exposed to the gas space R, there is a possibility that a hollow cathode electric discharge occurs at the supply port 512. When such a hollow cathode electric discharge occurs, it interferes with the plasma by inductive coupling, disabling a uniform plasma formation. According to this embodiment, the occurrence of the hollow cathode electric discharge is prevented between the dispersing plate 57a and the supply port 512 by providing the dispersing plate 57a that has a clearance from the supply port 512, and is installed at a location facing the supply port 512. Moreover, the process gas G2 is introduced into the gas space R near the window member 52 through the dispersing plate 57a from the supply port 512. Hence, the process gas G2 can be further exactly supplied to the gas space R near the antenna 55, enabling an acquisition of the highly efficient plasma.

(3) The flow channel of the process gas G2 between the dispersing plate 57a and the supply port 512 is blocked at the rotator-31 side, but is in connected with the gas space R at the window-member-52 side.

Hence, since the process gas G2 is supplied along the lower surface of the window member 52 to the vicinity of the window member 52 where an electric field is generated, plasma with high density is generated, improving the process efficiency. Moreover, since the flow channel of the process gas G2 between the dispersing plate 57a and the supply port 512 is blocked at the rotator-31 side, the process gas G2 is accumulated at the downstream side of the flow channel. The dispersing plate 57a is cooled by the cooling part 56 through the accumulated process gas G2. When the dispersing plate 57a is cooled, the deactivation of plasma is suppressed, and thus the plasma can be generated highly efficiently. Such an effect is further enhanced by the upper surface of the dispersing part 57 that contacts and is cooled by the bottom of the cooling part 56.

(4) The adjusting unit 54 adjusts the supply amount of the process gas G2 introduced from each of the supply ports 512 in accordance with the position of the rotator 31 in the direction that intersects the conveyance path T.

Hence, the supply amount of the process gas G2 from the plurality of supply ports 512 can be individually adjusted in accordance with the location where the passing speed of the surface of the rotator 31 differs.

(5) The plasma processing apparatus includes the film formation unit 40 provided at the location facing the workpiece W circulated and carried along the conveyance path T, and depositing the film formation material on the workpiece W by sputtering to form a film. The film processing by inductive coupling plasma is performed on the film of the film formation material deposited on the workpiece W by the film formation unit 40.

Hence, the film processing amount on the formed film can be also adjusted in accordance with the location where the passing speed of the surface of the rotator 31 differs.

(6) The supply port 512 is provided in the film formation region F that corresponds to a region where the film formation unit 40 forms the film, and is an annular region along the conveyance path T, and is also provided outside the film formation region F, and the supply port 512 provided outside the film formation region F is not subjected to the adjustment of the supply amount of the process gas G2 by the adjusting unit 54.

Thus, by providing the process gas G2 even at the region outside the film formation region F, the insufficiency of the flow volume of the process gas G2 at the end of the film formation region F can be suppressed. When, for example, the supply port 512 at the outermost circumference side and the supply port 512 at the innermost circumference side are located outside the film formation region F, by supplying the process gas G2, a uniform film processing can be achieved. However, as for the location outside the film formation region F at the outermost circumference side, even if the flow volume is not the maximum, the flow volume in the film formation region F does not become insufficient, and thus the flow volume can be saved. That is, the supply location of the process gas G2 outside the film formation region F serves as an auxiliary supply location and auxiliary supply port that compensates the flow volume of the process gas G2 in the film formation region F.

(7) The supply ports 512 are provided at locations facing with each other across the gas space R, and in the direction along the conveyance path T. Hence, the process gas G2 can be spread across the entire gas space R within a short time.

(8) The adjusting unit 54 adjusts the supply amount of the process gas G2 introduced from each supply port 512 in accordance with the film thickness to be formed on the workpiece W and the time at which the rotator 31 passes through the process region. This enables the film processing suitable for the film thickness.

(9) Since the pipes 53b and 53c are connected to the cylindrical body 51, and the process gas G2 is discharged from the cylindrical body 51, the detachment of the cylindrical member H from the plasma processing apparatus 100 is facilitated. That is, the cylinder member H can be detached while connecting the pipes 53b, 53c being to the cylindrical body 51. When, for example, the pipes 53b and 53c are introduced in the vacuum chamber 21 from the side surface of the vacuum container 20, and are connected to the cylindrical body 51, respectively, a labor work is necessary to disconnect the pipes 53b, 53c from the cylindrical body 51 when the cylindrical member H is detached from the plasma processing apparatus 100. Moreover, since it is necessary to connect again the pipe 53b and 53c to the cylindrical body 51 when the cylindrical member H is attached to the plasma processing apparatus 100, a tangled labor work is necessary. Alternatively, when the pipes 53b and 53c are introduced in the vacuum chamber 21 from the side surface of the vacuum container 20, a notch that avoids a contact with the pipes 53b, 53c may be provided in the cylindrical member H. In this case, although it becomes easy to detach the cylindrical member H from the plasma processing apparatus 100, the majority of the process gas G2 dispersed by the dispersing plate 57a leaks from the notch. Accordingly, since the process gas G2 cannot be introduced into the gas space R near the antenna 55, a highly efficient plasma cannot be acquired. In addition, the leaking process gas G2 may flow in the film formation unit 40, and may be mixed with the sputter gas G1. When the process gas G2 and the sputter gas G1 are mixed, the film formation rate by the film formation unit 40 may decrease. When the film formation rate by the film formation unit 40 decreases, the productivity decreases, and the optimized supply amount determined beforehand becomes not optimum, possibly decreasing the uniformity of the film quality. In contrast, the cylindrical member H according to this embodiment has a clearance between the bottom of the dispersing part 57 and the surface of the rotator 31 in the vertical direction narrowed to a length that enables the workpiece W to pass through. Hence, the leakage of the process gas G2 from the gas space R is suppressed. In addition, even if the process gas G2 slightly leaks, the leaking process gas G2 is prevented from flowing in the film formation unit 40 by the dividing unit 44.

(10) The supply amount of the process gas G2 from the plural locations can be calculated based on a specific condition. Hence, the control apparatus 70 may include a supply amount calculating unit that calculates the supply amount of the process gas G2. The supply amount calculating unit calculates the supply amount of the process gas G2 based on the condition input from the input apparatus 77 or the condition stored in the memory unit 74, etc. The calculated supply amount is set in the memory unit 74. Based on the set supply amount, the adjusting unit 54 adjusts the supply amount of the process gas G2 to be supplied from each supply port 512. A more specific example will be described below.

(Structure)

The basic structure of the plasma processing apparatus 100 is the same as that of the above described embodiment. The control apparatus 70 includes the supply amount calculating unit, and the memory unit 74 holds therein the film thickness at the innermost circumference side or the outermost circumference side, the optimized supply amount for this film thickness, and the distance from the rotation center of the rotator 31 to each supply port 512 (the radius of a circle passing through the center of each supply port 512).

(Calculation Process)

When it is desired to form a film with a uniform film thickness and a uniform film quality in a large area, the conditions that should be taken into consideration when the supply amount of the process gas G2 is adjusted are the following four conditions.

[1] Film thickness formed by the film formation unit while the rotator rotates by a turn.

[2] Film thickness distribution of the film formed in the radial direction of the rotator.

[3] Speed difference between the inner circumference of the rotator and the outer circumference thereof.

[4] Width of the plasma generating region (the width of the process region).

In this case, the condition [2] may be eliminated from those conditions when power is individually applied to each target 41A, 41B, and 41C of the film formation unit 40 to achieve a uniform film thickness. Moreover, like the above described embodiment, when the antenna 55 and the gas space R are in the external shape of a rectangular with rounded corners in the planar view, the width of the process region becomes consistent from the innermost circumference side toward the outermost circumference side of the film formation region F. Hence, the same plasma density can be achieved within the range of such a width, and thus the condition [4] may be also eliminated.

Accordingly, the supply amount from each supply port 512 can be determined based on the conditions [1] and [3]. That is, as for the condition [1], either the film thickness at the innermost circumference of the film formation region F or the film thickness at the outermost circumference thereof, and the optimized supply amount suitable for this film thickness are determined beforehand through tests etc. Next, as for the condition [3], since the speed difference between the inner circumference and the outer circumference is related (proportional) to the radius of the inner circumference and that of the outer circumference, the supply amount from each of the multiple supply ports 512 can determined based on the locations of the multiple supply ports 512 in the radial direction (the distance from the rotation center), the above film thickness and optimized supply amount. The film thickness to be formed at the innermost circumference of the film formation region F when the rotator 31 rotates by a turn, the film thickness to be formed at the outermost circumference of the film formation region F when the rotator 31 rotates by a turn, the optimized supply amount suitable for the film thickness, and the location of each supply port 512 in the radial direction are contained in the information stored in the memory unit 74.

For example, it is assumed that the optimized supply amount from the supply port 512 at the innermost circumference side relative to the predetermined film thickness of the film formed by the film formation unit 40 is a, the innermost circumference radius is Lin, the outermost circumference radius is Lou, and the optimized supply amount from the supply port 512 at the outermost circumference side is A. First, a case in which the optimized supply amount a from the supply port 512 at the innermost circumference side is known will be described. The supply amount calculating unit acquires, from the memory unit 74, the optimized supply amount a at the innermost circumference, the radius Lin of the circle passing through the supply port 512 at the innermost circumference side, and the radius Lou of the circle passing through the supply port 512 at the outermost circumference side, and calculates the optimized supply amount A at the outermost circumference side based on the following formula.

$$A = a \times Lou/Lin$$

Likewise, the optimized supply amounts from the other supply ports 512 are also calculated in accordance with the ratio of the radius. That is, when optimized supply amount from the supply port 512 is Ax, and the radius of the circle that passes through this supply port 512 is Px, the optimized supply amount Ax can be determined based on the following formula.

$$Ax = a \times Px/Lin$$

Conversely, when the optimized supply amount A from the supply port 512 at the outermost circumference side is known, the optimized supply amount ax from each supply port 512 can be determined from the following formula based on the radius px of the circle passing through this supply port 512.

$$Ax = A \times px/Lou$$

(Effect)

As described above, when the film thickness to be formed by the film formation unit 40 is known while the rotator rotates by a turn (above condition [1]), the supply amounts from the multiple supply ports 512 can be automatically determined. Hence, as for a pattern in which the supply amount from each supply port 512 is estimated, the amount of data to be held in the memory unit 74 can be reduced in comparison with a case in which a large number of pieces of data is held. In the case of, for example, the film that changes the refractive index depending on the composition like SiON, the supply amount from each supply port 512 can be automatically determined based on the film thickness at the innermost circumference side of the film formation region F, or at the outermost circumference side thereof. Accordingly, when the mixture ratio between $N_2$ and $O_2$ is adjusted, a film with a desired refractive index can be achieved.

OTHER EMBODIMENTS

The present disclosure is not limited to the above described embodiment, and also covers the following forms.

(1) As for the film formation material, various materials capable of forming a film by sputtering are applicable. For example, tantalum, titanium, aluminum, etc. are applicable. As for the materials to be a chemical compound, various materials are also applicable.

(2) The number of the targets in the film formation unit is not limited to three. The number of targets may be one, two, or equal to or greater than four. When the number of targets is increased and the applied power to each target is adjusted, a control for a further fine film thickness is enabled. In addition, the number of film formation units may be one, two or equal to or greater than four. When the number of film formation units is increased, the film formation rate can be increased. In accordance with the increased number of film formation units, when the number of film processing units is increased, the film processing rate can be also increased.

(3) The film formation by the film formation unit is not always necessary, and the film formation unit may be omitted. That is, the present disclosure is not limited to the plasma processing apparatus that performs film processing, but is applicable to plasma processing apparatuses that process an object to be processed using active species produced by plasma. For example, a plasma processing apparatus that generates plasma in the gas space of the processing unit, and performs surface reformation, such as etching and asking, and cleaning may be achieved. In this case, for example, an inactive gas like argon may be applied as the process gas.

(4) The supply port of the process gas may be provided in component other than the cylindrical body. For example, each pipe in the supply unit may be extended in the cylindrical body, and the respective leading ends of the pipes may be adopted as the supply ports. The leading end of the pipe may have a narrowing diameter so as to be a nozzle. In this case, in addition to the film formation region, the pipe may be provided outside the film formation region, and an auxiliary supply port and an auxiliary nozzle that compensate the flow volume of the process gas in the film formation region may be achieved.

(5) The number of locations where the supply unit supplies the process gas, and the number of supply ports may be a multiple number corresponding to the locations where the passing speed of the surface of the rotator differs, and is not limited to the number exemplified in the above described embodiment. By providing equal to or greater than three locations within the film formation region in a row, the flow volume can be further finely controlled in accordance with the processing position. Moreover, the greater the number of supply locations and the supply ports is increased, the closer the distribution of the gas flow volume becomes linear, and thus a local process variability can be suppressed. The supply ports may be provided in any row other than the two rows that face the cylindrical body. Furthermore, the supply ports may be arranged so as to be shifted one by one in a height direction instead of providing the supply ports in a line.

(6) The structure of the adjusting unit is not limited to the above described example. A manual valve may be provided in each pipe so as to carry out a manual adjustment. As long as the gas supply amount is adjustable, the pressure may be constant and such a pressure may be adjusted by opening or closing the valve, or the pressure may be increased or decreased. The adjusting unit may be achieved by the supply ports. For example, the supply port with a different diameter may be provided in accordance with the location where the passing speed of the surface of the rotator differs, and the supply amount of the process gas may be adjusted. The supply ports may be replaceable with nozzles that have different diameters. Moreover, the diameter of the supply port may be changed by a shutter, etc.

(7) Since the speed corresponds to a distance traveled per a unit time, in view of the relationship with the time necessary to pass through the process region in the radial direction, the supply amount of the process gas from each supply port may be set.

(8) The shape of the cylindrical body, the window member, and the antenna are not limited to the examples in the above described embodiment, and a horizontal cross-section may be a square, circular, or elliptical form. However, since the passing time of the workpiece W differs at the inner circumference side and at the outer circumference side when the shape that has an equal pitch at the inner circumference side and at the outer circumference side is adopted, the adjustment of the supply amount of the process gas in accordance with a difference in the process time is facilitated. Moreover, when the shape that has an equal pitch at the inner circumference side and at the outer circumference side is adopted, a space can be formed between the dividing unit 44 that divides the film formation unit 40 and the film processing unit 50. Hence, an effect of preventing the process gas G2, such as oxygen or nitrogen, from flowing in the film formation unit 40 can be enhanced. Moreover, the process region may be formed in a sector shape by forming the antenna in a sector shape. In this case, the time necessary to pass through the process region remains substantially unchanged or substantially consistent even if the speed increases toward the outer circumference side, the supply amount of the process gas may be consistent.

(9) The number of trays and workpieces simultaneously carried by the conveyance unit, and the number of the holding units holding those may be at least one, and are not limited to the numbers described in the above embodiment. That is, a configuration in which the one workpiece W is circulated and carried is adoptive, and a configuration in which equal to or greater than two workpieces W are circulated and carried is also adoptive. A configuration in which the workpieces W that are aligned in equal to or greater than two lines in the radial direction are circulated and carried is also adoptive.

(10)
In the above described embodiment,
although the rotator is the rotation table, the rotator is not limited to table. The rotator may be a rotation body that holds the tray and the workpiece on the arm extended radially from the rotation center, and rotates together with such an arm. The film formation unit and the film processing unit may be located at the bottom side of the vacuum container, and the positional relationship in the vertical direction between the film formation unit and the film processing unit, and, the rotator may be inverted. In this case, the surface of the rotator on which the holding unit is installed becomes the surface directed downwardly when the rotator is in the horizontal direction, i.e., the lower surface.

(11) Although the embodiment of the present disclosure and the modifications of each component have been described above, such embodiment and the modifications of each component are merely presented as examples, and are not intended to limit the scope of the present disclosure. The above described novel embodiments can be carried out in other various forms, and various omissions, replacements, and modifications can be made thereto without departing from the scope of the present disclosure. Such embodiment and modifications thereof are within the scope of the present disclosure, and are also within the scope of the invention as recited in the appended claims.

What is claimed is:

1. A plasma processing apparatus comprising:
a vacuum container capable of achieving a vacuumed interior;
a conveyance unit that comprises a rotator having a surface that holds a workpiece and a rotation axis, and circulates and carries the workpiece along a circular conveyance path;
a cylindrical member having an opening at one end extended in a direction toward the circular conveyance path in the vacuum container;
a window member provided at the cylindrical member, and dividing a gas space between an interior of the cylindrical member and the rotator from an exterior;
a supply unit supplying the process gas in the gas space; and
an antenna installed facing the window member and outside the gas space, and causing the process gas in the gas space to generate inductive coupling plasma for plasma processing on the workpiece passing through the circular conveyance path when power is applied,
wherein:
the rotation axis extends in a direction intersecting the surface;
the window member comprises a surface facing the surface of the rotator;
the supply unit comprises a plurality of supply ports supplying the process gas in the gas space and an adjusting unit individually adjusting supply amounts of the process gas from the plurality of supply ports;
the plurality of supply ports is provided between the surface of the window member and the surface of the rotator and along a direction intersecting the circular conveyance path; and
the adjusting unit adjusts the supply amount of the process gas introduced from each of the supply ports in accordance with a position in a direction that intersects the circular conveyance path.

2. The plasma processing apparatus according to claim 1, further comprising a dispersing plate installed at a location that faces the supply port with a clearance therefrom, dispersing the process gas supplied from the supply port, and causing the dispersed process gas to flow into the gas space.

3. The plasma processing apparatus according to claim 2, wherein a flow channel of the process gas between the dispersing plate and the supply port is blocked at a rotator side, but is in connected with the gas space at a window-member side.

4. The plasma processing apparatus according to claim 1, wherein the adjusting unit adjusts the supply amount of the process gas introduced from each of the supply ports per a unit time so as to increase from the inner circumference side of the rotator toward the outer circumference side of the rotator in a direction that intersects the circular conveyance path.

5. The plasma processing apparatus according to claim 1, further comprising a film formation unit provided at a location facing the workpiece circulated and carried along the circular conveyance path, and depositing a film formation material on the workpiece by sputtering to form a film,
wherein the plasma processing by inductive coupling plasma is performed on a film of the film formation material deposited on the workpiece by the film formation unit.

6. The plasma processing apparatus according to claim 5, wherein:
the supply ports are provided in a film formation region that corresponds to a region where the film formation unit forms the film, and is an annular region along the circular conveyance path, and are also provided in an area between the film formation region and the inner wall of the chamber; and
the supply port provided in the area between the film formation region and the inner wall of the chamber is not subjected to the adjustment of the supply amount of the process gas by the adjusting unit.

7. The plasma processing apparatus according to claim 5, wherein the supply ports are provided at locations facing with each other across the gas space, and in a direction along the circular conveyance path.

8. The plasma processing apparatus according to claim 5, wherein the adjusting unit adjusts the supply amount of the process gas introduced from each of the supply ports in accordance with a film thickness to be formed on the workpiece and the passing time.

9. The plasma processing apparatus according to claim 3, further comprising a film formation unit provided at a location facing the workpiece circulated and carried along the circular conveyance path, and depositing a film formation material on the workpiece by sputtering to form a film,
wherein the plasma processing by inductive coupling plasma is performed on a film of the film formation material deposited on the workpiece by the film formation unit.

10. The plasma processing apparatus according to claim 9, wherein:
the supply ports are provided in a film formation region that corresponds to a region where the film formation unit forms the film, and is an annular region along the circular conveyance path, and are also provided in an area between the film formation region and the inner wall of the chamber; and
the supply port provided in the area between the film formation region and the inner wall of the chamber is not subjected to the adjustment of the supply amount of the process gas by the adjusting unit.

11. The plasma processing apparatus according to claim 9, wherein the supply ports are provided at locations facing with each other across the gas space, and in a direction along the circular conveyance path.

12. The plasma processing apparatus according to claim 11, wherein the adjusting unit adjusts the supply amount of the process gas introduced from each of the supply ports in accordance with a film thickness to be formed on the workpiece and the passing time.

13. The plasma processing apparatus according to claim 10, wherein the supply ports are provided at locations facing with each other across the gas space, and in a direction along the circular conveyance path.

14. The plasma processing apparatus according to claim 13, wherein the adjusting unit adjusts the supply amount of the process gas introduced from each of the supply ports in accordance with a film thickness to be formed on the workpiece and the passing time.

15. A plasma processing apparatus comprising:
a vacuum container capable of achieving a vacuumed interior;
a conveyance unit that comprises a rotator having a surface that holds a workpiece and a rotation axis, and circulates and carries the workpiece along a circular conveyance path;
a cylindrical member having an opening at one end extended in a direction toward the circular conveyance path in the vacuum container;
a window member provided at the cylindrical member, and dividing a gas space between an interior of the cylindrical member and the rotator from an exterior;
a supply unit supplying the process gas in the gas space; and
an antenna installed facing the window member and outside the gas space, and causing the process gas in the gas space to generate inductive coupling plasma for plasma processing on the workpiece passing through the circular conveyance path when power is applied, wherein:
the rotation axis extends in a direction intersecting the surface;
the window member comprises a surface facing the surface of the rotator;
the supply unit comprises a plurality of supply ports supplying the process gas in the gas space and an adjusting unit individually adjusting supply amounts of the process gas from the plurality of supply ports;
the plurality of supply ports is provided between the surface of the window member and the surface of the rotator and along a direction intersecting the circular conveyance path;
the plasma processing by inductive coupling plasma is performed on a film of a film formation material deposited on the workpiece by a film formation unit; and
the adjusting unit adjusts the supply amount of the process gas introduced from each of the supply ports in accordance with a film thickness to be formed on the workpiece and the passing time.

16. The plasma processing apparatus according to claim 15, wherein:
the supply ports are provided in a film formation region that corresponds to a region where the film formation unit forms the film, and is an annular region along the circular conveyance path, and are also provided in an area between the film formation region and the inner wall of the chamber; and
the supply port provided in the area between the film formation region and the inner wall of the chamber is not subjected to the adjustment of the supply amount of the process gas by the adjusting unit.

17. The plasma processing apparatus according to claim 15, wherein the supply ports are provided at locations facing with each other across the gas space, and in a direction along the circular conveyance path.

* * * * *